United States Patent
Jeong et al.

(10) Patent No.: US 10,785,887 B2
(45) Date of Patent: Sep. 22, 2020

(54) ELECTRONIC DEVICE INCLUDING COOLING FUNCTION AND CONTROLLING METHOD THEREOF

(71) Applicant: SAMSUNG ELECTRONICS CO., LTD., Suwon-si, Gyeonggi-do (KR)

(72) Inventors: Chihwan Jeong, Suwon-si (KR); Kyungha Koo, Seoul (KR); Kiyoun Jang, Suwon-si (KR); Se-Young Jang, Seongnam-si (KR); Han-Shil Choi, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 373 days.

(21) Appl. No.: 15/938,192

(22) Filed: Mar. 28, 2018

(65) Prior Publication Data
US 2018/0288898 A1 Oct. 4, 2018

(30) Foreign Application Priority Data
Mar. 28, 2017 (KR) .......................... 10-2017-0039427

(51) Int. Cl.
*H05K 7/20* (2006.01)
*H02J 50/80* (2016.01)
(Continued)

(52) U.S. Cl.
CPC ............ *H05K 7/20* (2013.01); *G06F 1/1632* (2013.01); *G06F 1/203* (2013.01); *H02J 7/0027* (2013.01);
(Continued)

(58) Field of Classification Search
CPC .......... G06F 1/181–182; G06F 1/1632; G06F 1/203; H05K 7/20218–20381;
(Continued)

(56) References Cited

U.S. PATENT DOCUMENTS 7,738,238 B2 * 6/2010 Liu .......................... H04N 5/64
341/20
2013/0114203 A1 5/2013 Ignatchenko et al.

FOREIGN PATENT DOCUMENTS

EP          2 124 516       11/2009
KR    20-2004-0021970      11/2004

OTHER PUBLICATIONS

Extended Search Report dated Dec. 3, 2018 in counterpart European Patent Application No. EP18164573.0.
(Continued)

*Primary Examiner* — Mandeep S Buttar
(74) *Attorney, Agent, or Firm* — Nixon & Vanderhye, P.C.

(57) ABSTRACT

According to various embodiments an electronic device may include a first housing comprising a hollow portion configured to receive an external electronic device, and a second housing disposed at an angle defined by a portion coupled with at least part of the hollow portion. The second housing may include a first cover facing at least part of the hollow portion and comprising a plurality of first openings, a second cover received in the first cover and comprising a plurality of second openings, and an electric fan motor disposed in a space between the first cover and the second cover, the electric fan motor configured to discharge at least part of intake air from at least some of the first openings to at least some of the second openings.

11 Claims, 17 Drawing Sheets

(51) Int. Cl.
  *H02J 7/00* (2006.01)
  *H02J 50/12* (2016.01)
  *G06F 1/20* (2006.01)
  *G06F 1/16* (2006.01)
  *H02J 7/02* (2016.01)
(52) U.S. Cl.
  CPC .......... *H02J 7/0044* (2013.01); *H02J 7/0091* (2013.01); *H02J 7/025* (2013.01); *H02J 50/12* (2016.02); *H02J 50/80* (2016.02)
(58) Field of Classification Search
  CPC .. H05K 7/20409–20418; H05K 7/20009–202; H05K 7/20; H01L 23/367–3677; H01L 23/473; H01L 23/46–467; H02J 50/12; H02J 50/80; H02J 7/0027; H02J 7/0044; H02J 7/0091; H02J 7/025
  USPC ......... 361/679.48, 688, 704, 679.55, 679.46; 165/80.3, 104.33, 80.2
  See application file for complete search history.

(56) References Cited

OTHER PUBLICATIONS

Partial Search Report dated Aug. 22, 2018 in counterpart European Patent Application No. EP18164573.0.

\* cited by examiner

ELECTRONIC DEVICE INCLUDING COOLING FUNCTION AND CONTROLLING METHOD THEREOF

CROSS-REFERENCE TO RELATED APPLICATION

This application is based on and claims priority under 35 U.S.C. § 119 to Korean Patent Application No. 10-2017-0039427, filed on Mar. 28, 2017, in the Korean Intellectual Property Office, the disclosure of which is incorporated by reference herein in its entirety.

TECHNICAL FIELD

The present disclosure relates to an electronic device having a cooling function which cools an external electronic device, and a controlling method thereof.

BACKGROUND

A portable electronic device is an assembly of electronic device components and can perform various functions. For example, in addition to a basic communication function, various voice services (e.g., voice recognition function) based on voice recognition technology are developed and released. Various life services such as mobile search, schedule management, call, memo, video play, and music play are provided based on user's voice commands.

The portable electronic device can rest on a separate stationary electronic device, and charge its internal battery through a connector of the stationary electronic device by wire or wirelessly. According to an embodiment, the portable electronic device may perform data communication via the stationary electronic device which is connected to an external electronic device. According to an embodiment, the electronic device resting on the stationary electronic device can perform the above-stated various multimedia functions while charging its internal battery or exchanging data with the external electronic device. According to an embodiment, the portable electronic device can rest on the stationary electronic device at a level with a bottom surface or at a specific angle based on the bottom surface.

Recent stationary electronic devices provide not only the charging function or the data exchange function of the portable electronic device but also various functions for improving performance of the resting portable electronic device.

The portable electronic device can rest on the stationary electronic device for the sake of the charging or the data exchange. The portable electronic device can produce heat during the charging or the data exchange, and continuous high heat can degrade performance of the portable electronic device. Moreover, the portable electronic device resting on the stationary electronic device can concurrently execute another function (e.g., video play, sound play, web searching, etc.) during the charging or the data exchange, which can further aggravate the heat of the electronic device.

SUMMARY

Various embodiments provide an electronic device having a cooling function which can effectively dissipate heat generating from a resting electronic device, and a controlling method thereof.

Various embodiments provide an electronic device having a cooling function which can effectively control a cooling level based on a heat temperature of the electronic device, and a controlling method thereof.

According to various embodiments, an electronic device may include a first housing including a hollow portion configured to receive an external electronic device, and a second housing disposed at an angle defined by a portion coupled with at least part of the hollow portion. The second housing may include a first cover facing at least part of the hollow portion and including a plurality of first openings, a second cover received in the first cover and including a plurality of second openings, and an electric fan motor disposed in a space between the first cover and the second cover, and the electric fan configured to discharge at least part of intake air from at least some of the first openings to at least some of the second openings.

According to various embodiments, an electronic device may include a first housing including a plurality of first openings, a second cover received in a first cover and including a plurality of second openings, an electric fan motor disposed in a space between the first cover and the second cover, and configured to discharge at least part of intake air from at least some of the first openings to at least some of the second openings, a wireless charging circuit disposed between the electric fan motor and the second cover, and a control circuit. The control circuit may be configured to detect the external electronic device which is disposed to face the second cover, using the wireless charging circuit, and when wirelessly charging the external electronic device using the wireless charging circuit, to discharge at least part of the intake air to the wireless charging circuit and the external electronic device using the electric fan motor.

According to various embodiments, a method for operating an electronic device may include detecting whether the electronic device rests in an external electronic device having a cooling function, detecting whether the electronic device is functionally connected to the external electronic device having the cooling function when detecting the resting, monitoring a temperature of the electronic device when detecting the connection, generating a control command corresponding to the monitored temperature, and sending the generated control command to the external electronic device having the cooling function.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

Throughout the drawings, like reference numerals will be understood to refer to like parts, components and structures.

DETAILED DESCRIPTION

Figure 1:
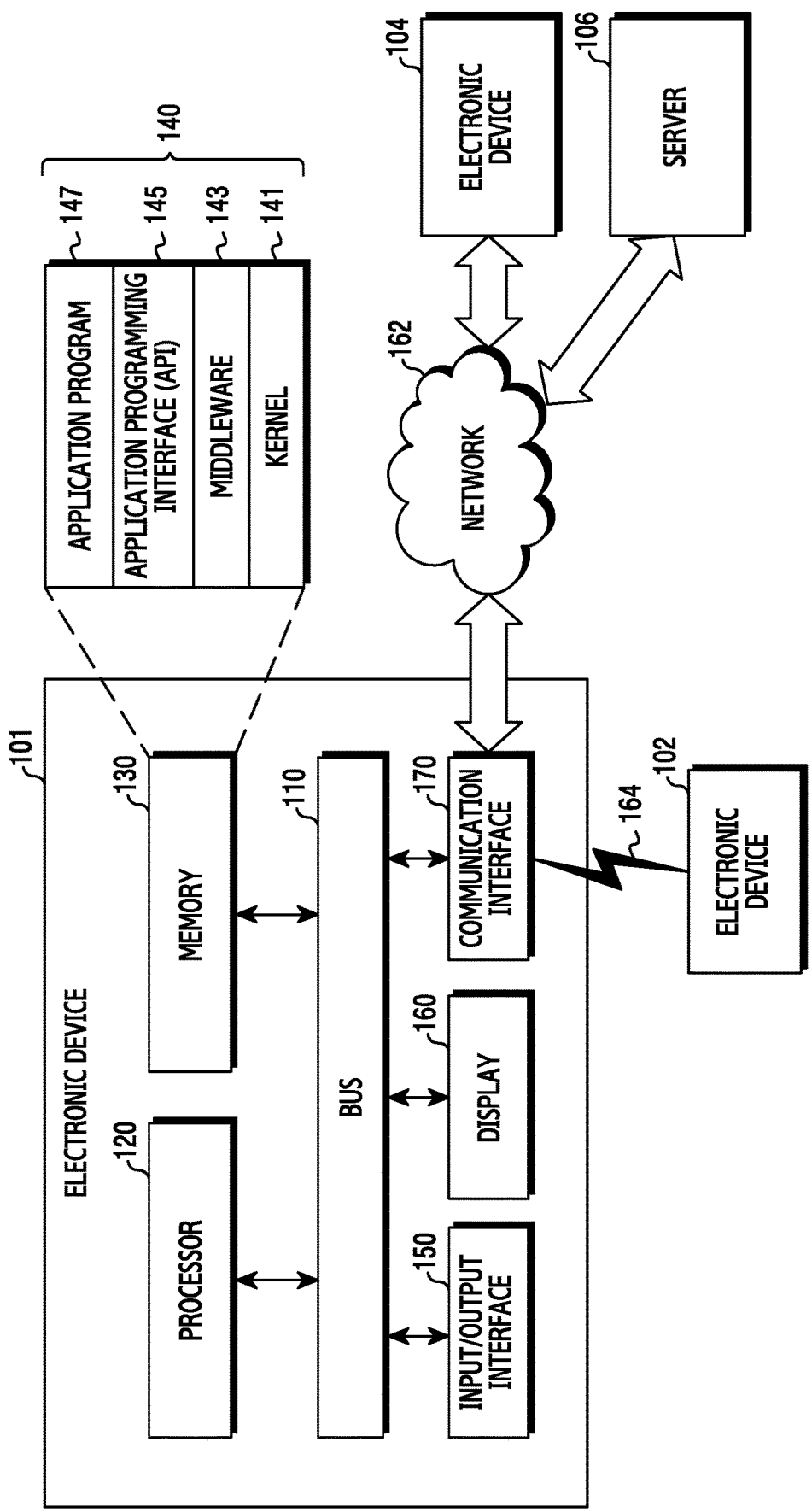
FIG. 1 is a diagram illustrating an example network environment including an external electronic device according to various embodiments of the present disclosure.

Embodiments of the present disclosure will now be described in greater detail with reference to the accompanying drawings, in which similar reference numerals may be used to refer to similar elements. In the following disclosure, specific details such as detailed configuration and components are merely provided to aid in the overall understanding of these example embodiments of the present disclosure. Therefore, it should be apparent to those skilled in the art that various changes and modifications of the embodiments described herein can be made without departing from the scope and spirit of the present disclosure. For example, those skilled in the art will understand that the principles of the present disclosure may be implemented in any suitably arranged electronic device.

In addition, descriptions of well-known functions and constructions may be omitted for clarity and conciseness.

The terms and words used in the following description and claims are not limited to their dictionary meanings, but are used to convey a clear and consistent understanding of the present disclosure. Accordingly, it should be apparent to those skilled in the art that the following description of embodiments of the present disclosure is provided for illustrative purposes only and not for the purpose of limiting the present disclosure, as defined by the appended claims and their equivalents.

Singular terms such as "a," "an," and "the" include plural references unless the context clearly dictates otherwise. Thus, for example, "a component surface" includes reference to one or more of such surfaces.

Herein, terms such as "have," "may have," "include," and "may include" refer to the presence of corresponding features (e.g., elements such as numerical values, functions, operations, or parts), but do not preclude the presence of additional features.

The terms "A or B," "at least one of A or/and B," and "one or more of A or/and B" include all possible combinations of the enumerated items. For example, "A or B," "at least one of A and B," or "at least one of A or B" means (1) at least one A, (2) at least one B, or (3) at least one A and at least one B.

Numerical terms, such as "first" and "second", may be used to identify various elements regardless of an order and/or importance of the elements, and do not limit the elements. These terms may be used for the purpose of distinguishing one element from another element. For example, a first user device and a second user device may indicate different user devices, regardless of the order or importance the devices. Accordingly, a first element may be referred to as a second element, and similarly, a second element may be referred to as a first element, without departing from the scope the present disclosure.

When an element (e.g., a first element) is "(operatively or communicatively) coupled with/to" or "connected to" another element (e.g., a second element), the first element may be directly "coupled with/to" the second element, or there may be an intervening element (e.g., a third element) between the first element and the second element. However, when the first element is "directly coupled with/to" or "directly connected to" the second element, there is no intervening element therebetween.

Herein, the term "module" may refer, for example, to a unit including one of hardware, software, and firmware, or any combination thereof. The term "module" may be interchangeably used with terms, such as unit, logic, logical block, component, and circuit. A module may be a minimum unit of an integrally constituted component or may be a part thereof. A module may be a minimum unit for performing one or more functions or may be a part thereof. A module may be mechanically or electrically implemented. For example, a module may include, without limitation, at least one of a dedicated processor, a central processing unit (CPU), an application-specific integrated circuit (ASIC) chip, a field-programmable gate array (FPGA), and a programmable-logic device, or the like, which are known or will be developed and which perform certain operations.

All of the terms used herein, including technical or scientific terms, have the same meanings as those generally understood by a person having ordinary skill in the related art unless they are defined otherwise. Terms defined in a generally used dictionary should be interpreted as having the same or similar meanings as the contextual meanings of the relevant technology and should not be interpreted as having ideal or exaggerated meanings unless clearly defined as such herein. Even where terms are defined in the disclosure, the terms should not be interpreted as excluding embodiments of the present disclosure.

Example electronic devices may include smart phones, tablet personal computers (PCs), mobile phones, video telephones, electronic book readers, desktop PCs, laptop PCs, netbook computers, workstations, servers, personal digital assistants (PDAs), portable multimedia players (PMPs), motion picture experts group (MPEG-1 or MPEG-2) audio layer 3 (MP3) players, mobile medical devices, cameras, and/or wearable devices, or the like, but are not limited thereto. For example, the wearable devices may include accessory-type wearable devices (e.g., watches, rings, bracelets, anklets, necklaces, glasses, contact lenses, or head-mounted-devices (HMDs)), fabric or clothing integral wearable devices (e.g., electronic clothes), body-mounted wearable devices (e.g., skin pads or tattoos), and/or implantable wearable devices (e.g., implantable circuits), or the like, but are not limited thereto.

The electronic devices may include smart home appliances, such as televisions (TVs), digital versatile disk (DVD) players, audio players, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ and PlayStation™), electronic dictionaries, electronic keys, camcorders, and/or electronic picture frames, or the like, but are not limited thereto.

The electronic devices may include a medical device, such as a portable medical measurement device (e.g., a blood glucose meter, a heart rate monitor, a blood pressure monitor, or a thermometer), a magnetic resonance angiography (MRA) device, a magnetic resonance imaging (MRI) device, a computed tomography (CT) device, a scanner, an ultrasonic device, a navigation device, a GPS receiver, an event data recorder (EDR), a flight data recorder (FUR), a vehicle infotainment device, electronic equipment for a vessel (e.g., navigation systems, gyrocompasses, etc.), an avionic device, a security device, a head unit for a vehicle, an industrial or home robot, an automatic teller machine (ATM), a point of sale (POS) device, and/or an Internet of Things (IoT) device (e.g., a light bulb, sensor, electric or gas meter, sprinkler device, fire alarm, thermostat, street lamp, toaster, exercise equipment, hot water tank, heater, or boiler), or the like, but are not limited thereto.

The electronic device may also include a part of furniture or building/structure, electronic board, electronic signature receiving device, projector, or measuring instrument (e.g., water meter, electricity meter, gas meter, or wave meter), or the like, but is not limited thereto.

The electronic device may be a flexible electronic device.

The electronic device may be a combination of the above-described devices.

Additionally, the electronic device of the present disclosure is not limited to the above-described devices, and may include a new electronic device according to the development of new technologies.

Herein, the term "user" may refer to a person who uses an electronic device or may refer to a device (e.g., an artificial intelligence (AI) electronic device) which uses an electronic device.

FIG. 1 is a diagram illustrating an example network environment including an electronic device, according to an embodiment of the present disclosure.

Referring to FIG. 1, the network environment includes an electronic device 101, which includes a bus 110, a processor (e.g., including processing circuitry) 120, a memory 130, an input/output interface (e.g., including input/output circuitry) 150, a display 160, and a communication interface (e.g., including communication circuitry) 170. Alternatively, the electronic device 101 may omit at least one of the illustrated components and/or include additional components.

The bus 110 is a circuit for connecting the components 120 through 170 and delivering communications such as a control message therebetween.

The processor 120 may include various processing circuitry, such as, for example, and without limitation, at least one of a dedicated processor, a CPU, an application processor (AP), and/or a communication processor (CP), or the like. The processor 120 processes an operation or data on control of and/or communication with another component of the electronic device 101.

The processor 120 may also include a microprocessor or any suitable type of processing circuitry, such as one or more general-purpose processors (e.g., ARM-based processors), a digital signal processor (DSP), a programmable logic device (PLD), an ASIC, a field-programmable gate array (FPGA), a graphical processing unit (GPU), a video card controller, etc. In addition, when a general purpose computer accesses code for implementing the processing shown herein, the execution of the code transforms the general purpose computer into a special purpose computer for executing the processing shown herein.

The processor 120, which can be connected to an LTE network, may determine whether a call is connected over a circuit switched (CS) service network using caller identification information, such as a caller phone number of the CS service network, e.g., a 2G or a 3rd generation (3G) network. For example, the processor 120 receives incoming call information, such as a CS notification message or a paging request message of the CS service network over the LTE network, such as circuit-switched fallback (CSFB). The processor 120 being connected to the LTE network receives incoming call information, such as a paging request message over the CS service network, such as single radio LTE (SRLTE).

When receiving an incoming CS notification message or a paging request message of the CS service network over the LTE network, the processor 120 may obtain caller identification information from the incoming call information. The processor 120 may display the caller identification information on the display 160. The processor 120 may determine whether to connect the call based on input information corresponding to the caller identification information displayed on the display 160. For example, when detecting input information corresponding to an incoming call rejection, through the input/output interface 150, the processor 120 may restrict the voice call connection and maintain the LTE network connection. When detecting input information corresponding to an incoming call acceptance, through the input/output interface 150, the processor 120 may connect the voice call by connecting to the CS service network.

When receiving the incoming CS notification message or a paging request message of the CS service network over the LTE network, the processor 120 may obtain caller identification information from the incoming call information. The processor 120 may determine whether to connect the call by comparing the caller identification information with a reception control list. For example, when the caller identification information is included in a first reception control list, such as a blacklist, the processor 120 may restrict the voice call connection and maintain the connection to the LTE network. When the caller identification information is not included in the blacklist, the processor 120 may connect the voice call by connecting to the CS service network. When the caller identification information is included in a second reception control list, such as a white list, the processor 120 may connect the voice call by connecting to the CS service network.

When receiving the incoming call information, such as a paging request message of the CS service network over the LTE network, the processor 120 may send an incoming call response message, such as a paging response message, to the CS service network. The processor 120 may suspend the LTE service and receive the caller identification information, such as a circuit-switched call (CC) setup message, from the CS service network. The processor 120 may determine whether to connect the call by comparing the caller identification information with the reception control list. For example, when the caller identification information is included in the blacklist, the processor 120 restricts the voice call connection and resumes the LTE network connection. When the caller identification information is not included in the the blacklist, the processor 120 may connect the voice call by connecting to the CS service network. For example, when the caller identification information is included in the white list, the processor 120 connects the voice call by connecting to the CS service network.

The memory 130 may include volatile and/or nonvolatile memory. The memory 130 may store commands or data, such as the reception control list relating to the other components of the electronic device 101. The memory 130 may store software and/or a program 140. The program 140 includes a kernel 141, middleware 143, an application programming interface (API) 145, and/or applications 147. At least some of the kernel 141, the middleware 143, and the API 145 may be referred to as an operating system (OS).

The kernel 141 may control or manage system resources, such as the bus 110, the processor 120, or the memory 130, used for performing an operation or function implemented by the other programs, such as the middleware 143, the API 145, or the application 147. Further, the kernel 141 may provide an interface for allowing the middleware 143, the API 145, or the application 147 to access individual elements of the electronic device 101 to control or manage the system resources.

The middleware 143 may function as an intermediary for the API 145 or the applications 147 to communicate with the kernel 141, e.g., to exchange data.

In addition, the middleware 143 may process one or more task requests received from the application 147 according to priorities thereof. For example, the middleware 143 assigns priorities for using the system resources of the electronic device 101, to at least one of the application 147. As another example, the middleware 143 performs scheduling or load balancing on the one or more task requests by processing the one or more task requests according to the priorities assigned thereto.

The API 145 is an interface through which the applications 147 may control functions provided from the kernel 141 or the middleware 143, and may include at least one interface or function, such as an instruction for file control, window control, image processing, or text control.

The input/output interface 150 may include various input/output circuitry and function as an interface that transfers instructions or data input from a user or another external device to the other elements of the electronic device 101. Further, the input/output interface 150 may output the instructions or data received from the other elements of the electronic device 101 to the user or an external electronic device.

The display 160 may include a liquid crystal display (LCD), a light emitting diode (LED) display, an organic LED (OLED) display, a micro electro mechanical system (MEMS) display, an electronic paper display, or the like, but is not limited thereto. The display 160 may display various types of content, such as text, images, videos, icons, or symbols. The display 160 may display a web page.

The display 160 may include a touch screen, which receives a touch, a gesture, proximity, a hovering input, etc., using an electronic pen or a user's body part (e.g., a finger).

The communication interface 170 may include various communication circuitry and establish communication between the electronic device 101 and a first external electronic device 102, a second external electronic device 104, and/or a server 106. For example, the communication interface 170 communicates with the first external electronic device 102, the second external electronic device 104, and/or the server 106 through the network 162 using wireless communication or wired communication or via a short-range communication 164. For example, the wireless communication conforms to a cellular communication protocol including at least one of LTE, LTE-advanced (LTE-A), code division multiple access (CDMA), WCDMA, universal mobile telecommunication system (UMTS), wireless broadband (WiBro), and GSM.

The wired communication may include at least one of a universal serial bus (USB), a high definition multimedia interface (HDMI), a recommended standard 232 (RS-232), and a plain old telephone service (POTS).

The network 162 may include a telecommunications network, a computer network such as local area network (LAN) or wide area network (WAN), the Internet, and a telephone network.

The electronic device 101 may provide an LTE service in a single radio environment by use of at least one module functionally or physically separated from the processor 120.

Each of the first and second external electronic devices 102 and 104 may be the same or different type of device as the electronic device 101.

The server 106 may include a group of one or more servers.

All or some of the operations to be executed by the electronic device 101 may be executed by the first external electronic device 102, the second external electronic device 104, and/or the server 106. For example, when the electronic device 101 performs a certain function or service (automatically or by request), the electronic device 101 may request some functions that are associated therewith from the first external electronic device 102, the second external electronic device 104, and/or the server 106, instead of or in addition to executing the function or service itself. The first external electronic device 102, the second external electronic device 104, and/or the server 106 may execute the requested functions or additional functions, and may transmit the results to the electronic device 101. The electronic device 101 may provide the requested functions or services by processing the received results. For example, a cloud computing technique, a distributed computing technique, or a client-server computing technique may be used.

According to an embodiment of the present disclosure, the processor 210 may determine a current mode of the electronic device based on a result detected in at least one of the above-described sensor modules according to an example embodiment of the present disclosure. The processor 210 may generate a control signal based on the determined current mode, and may adjust an operating frequency band of a conductive member of the electronic device in a low band by controlling a tunable circuit using the corresponding control signal.

Figure 2:
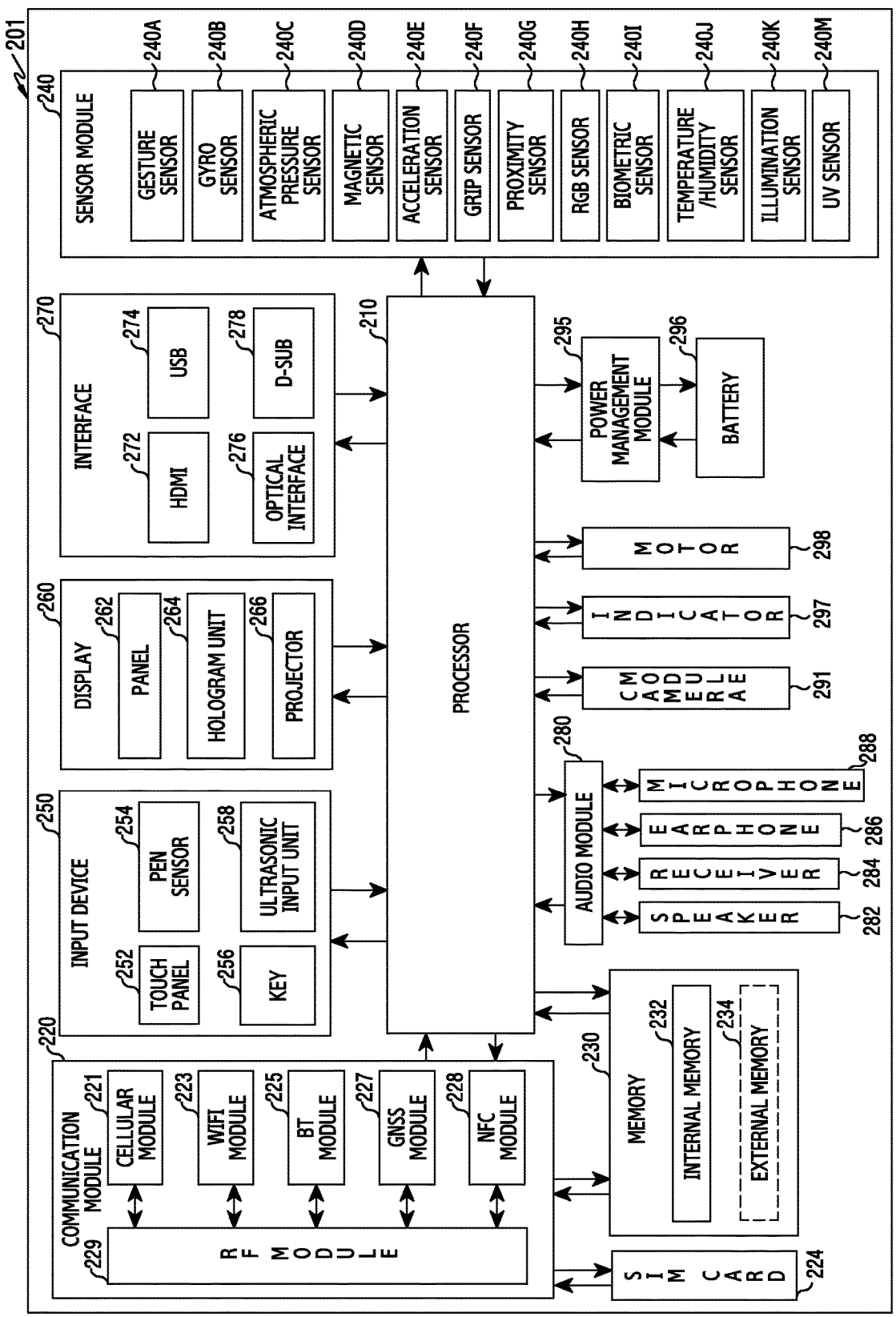
FIG. 2 is a block diagram illustrating an example external electronic device according to various embodiments of the present disclosure.

FIG. 2 is a diagram illustrating an example electronic device, according to an embodiment of the present disclosure.

Referring to FIG. 2, the electronic device 201 includes a processor (e.g., including processing circuitry) 210, a communication module (e.g., including communication circuitry) 220, a subscriber identification module (SIM) card 224, a memory 230, a sensor module 240, an input device (e.g., including input circuitry) 250, a display 260, an interface (e.g., including interface circuitry) 270, an audio module 280, a camera module 291, a power management module 295, a battery 296, an indicator 297, and a motor 298.

The processor 210 may include various processing circuitry and control a plurality of hardware or software elements connected to the processor 210 by driving an OS or an application program. The processor 210 may process a variety of data, including multimedia data, perform arithmetic operations, may be implemented with a system on chip (SoC), and may further include a GPU.

The communication module 220 may include various communication circuitry and perform data transmission/reception between an external electronic device and/or a server, which may be connected with the electronic device through a network. The communication module 220 may include various communication circuitry, such as, for example, and without limitation, at least one of a cellular module 221, a Wi-Fi module 223, a Bluetooth® (BT) module 225, a global navigation satellite system (GNSS) or GPS module 227, a near field communication (NFC) module 228, and a radio frequency (RF) module 229.

The cellular module 221 may provide a voice call, a video call, a text service, or an Internet service through a communication network, such as LTE, LTE-A, CDMA, WCDMA, UMTS, WiBro, or GSM. In addition, the cellular module 221 may identify and authenticate the electronic device within the communication network by using the SIM card 224. The cellular module 221 may perform at least some of the functions that can be provided by the processor 210. For example, the cellular module 221 may perform multimedia control functions.

The cellular module 221 may include a CP. Further, the cellular module 221 may be implemented, for example, with an SoC.

Although elements, such as the cellular module 221, the memory 230, and the power management module 295 are illustrated as separate elements with respect to the processor 210 in FIG. 2, the processor 210 may also be implemented such that at least one part of the aforementioned elements, e.g., the cellular module 221, is included in the processor 210.

The processor 210 or the cellular module 221 may load an instruction or data, which is received from each non-volatile memory connected thereto or at least one of different elements, to a volatile memory and processes the instruction or data. In addition, the processor 210 or the cellular module 221 may store data, which is received from at least one of different elements or generated by at least one of different elements, into a non-volatile memory.

Each of the Wi-Fi module 223, the BT module 225, the GNSS module 227, and the NFC module 228 may include a processor for processing data transmitted/received through a corresponding module. Although the cellular module 221, the Wi-Fi module 223, the BT module 225, the GNSS module 227, and the NFC module 228 are illustrated in FIG. 2 as separate blocks, at least two of the cellular module 221, the Wi-Fi module 223, the BT module 225, the GNSS module 227, and the NFC module 228 may be included in one integrated chip (IC) or IC package. For example, at least some of processors corresponding to the cellular module 221, the Wi-Fi module 223, the BT module 225, the GNSS module 227, and the NFC module 228, such as a communication processor corresponding to the cellular module 221 and a Wi-Fi processor corresponding to the Wi-Fi module 223, may be implemented with an SoC.

The RF module 229 may transmit/receive data, such as an RF signal, and may include a transceiver, a power amp module (PAM), a frequency filter, or a low noise amplifier (LNA). In addition, the RF module 229 may further include a component for transmitting/receiving a radio wave on a free space in wireless communication, e.g., a conductor or a conducting wire. The cellular module 221, the Wi-Fi module 223, the BT module 225, the GNSS module 227, and the NFC module 228 may share the RF module 229, or at least one of these modules may transmit/receive an RF signal via a separate RF module.

The SIM card 224 may be inserted into a slot formed in the electronic device. The SIM card 224 includes unique identification information, such as an integrated circuit card identifier (ICCID) or subscriber information, such as an international mobile subscriber identity (IMSI).

The memory 230 includes an internal memory 232 and/or an external memory 234.

The internal memory 232 may include at least one of a volatile memory, such as a dynamic random access memory (DRAM), a static RAM (SRAM), or a synchronous dynamic RAM (SDRAM) or a non-volatile memory, such as a one-time programmable read only memory (OTPROM), a programmable ROM (PROM), an erasable and programmable ROM (EPROM), an electrically erasable and programmable ROM (EEPROM), a mask ROM, a flash ROM, a not and (NAND) flash memory, and a not or (NOR) flash memory. The internal memory 232 may be a solid state drive (SSD).

The external memory 234 may include a flash drive, a compact flash (CF), secure digital (SD), micro-SD, mini-SD, extreme digital (xD), and a memory stick, and may be operatively coupled to the electronic device via various interfaces.

The electronic device may also include a storage unit (or a storage medium), such as a hard drive.

The sensor module 240 may measure a physical quantity or detect an operation state of the electronic device, and convert the measured or detected information into an electrical signal. The sensor module 240 includes a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H, e.g., a red, green, blue (RGB) sensor, a biometric sensor 240I, a temperature/humidity sensor 240J, an illumination sensor 240K, and an ultraviolet (UV) sensor 240M.

Additionally or alternatively, the sensor module 240 may include other sensors, e.g., an E-node sensor, an electromyography (EMG) sensor, an electroencephalogram (EEG) sensor, an electrocardiogram (ECG) sensor, and/or a fingerprint sensor.

The sensor module 240 may further include a control circuit for controlling at least one or more sensors included therein.

The input device 250 may include various input circuitry, such as, for example, and without limitation, at least one of a touch panel 252, a (digital) pen sensor 254, a key 256, and an ultrasonic input unit 258, or the like. The touch panel 252 may recognize a touch input using at least one of an electrostatic type configuration, a pressure-sensitive type configuration, and an ultrasonic type configuration. The touch panel 252 may further include a control circuit. When the touch panel is of the electrostatic type, both physical contact recognition and proximity recognition are possible. The touch panel 252 may further include a tactile layer, which provides the user with a tactile reaction.

The (digital) pen sensor 254 may include a recognition sheet which can be a part of the touch panel or can be separately implemented from the touch panel. The (digital) pen sensor 254 may be implemented using the same or similar method of receiving a touch input of a user or using an additional recognition sheet.

The key 256 may include a physical button, an optical key, or a keypad.

The ultrasonic input device 258 may detect ultrasonic waves generated by an input tool through a microphone 288, and may identify data corresponding to the detected ultrasonic waves.

The ultrasonic input unit 258 may detect a reflected sound wave through the microphone 288 and perform radio recognition. For example, an ultrasonic signal, which may be generated by using a pen, may be reflected off an object and detected by the microphone 288.

The electronic device may use the communication module 220 to receive a user input from an external device, such as a computer or a server connected thereto.

The display 260 includes a panel 262, a hologram device 264, and a projector 266.

The panel 262 may be an LCD or an AM-OLED and may be implemented in a flexible, transparent, or wearable manner. Alternatively, the panel 262 may be constructed as one module with the touch panel 252.

The hologram device 264 uses an interference of light and displays a stereoscopic image in the air.

The projector 266 displays an image by projecting a light beam onto a screen, which may be located inside or outside the electronic device.

The display 260 may further include a control circuit for controlling the panel 262, the hologram device 264, and/or the projector 266.

The interface 270 may include various interface circuitry, such as, for example, and without limitation, at least one of an HDMI 272, a USB 274, an optical communication interface 276, and a d-subminiature (D-sub) 278, or the like. The interface 270 may include a mobile high-definition link (MHL), SD/multi-media card (MMC), and/or Infrared Data Association (IrDA).

The audio module 280 bilaterally converts a sound and an electric signal. The audio module 280 converts sound information, which is input or output through a speaker 282, a receiver 284, an earphone 286, and/or the microphone 288.

The speaker 282 may output a signal of an audible frequency band and a signal of an ultrasonic frequency band. Reflected waves of an ultrasonic signal emitted from the speaker 282 and a signal of an external audible frequency band may be received.

The camera module 291 captures an image and/or a video, and may include one or more image sensors, such as a front sensor or a rear sensor, a lens, an image signal processor (ISP), or a flash, such as an LED or a xenon lamp. Alternatively, the electronic device may include two or more camera modules.

The power management module 295 manages power of the electronic device. The power management module 295 may include a power management integrated circuit (PMIC), a charger IC, and/or a battery gauge.

The PMIC may be included in an IC or an SoC semiconductor and may use a wired charging and/or a wireless charging method. The charger IC may charge the battery 296 and may prevent an over-voltage or over-current flow.

Different types of wireless charging may include magnetic resonance type, magnetic induction type, and electromagnetic type. An additional circuit for the wireless charging, such as a coil loop, a resonant circuit, and/or a rectifier may be added.

The battery gauge may measure a residual quantity of the battery 296 and a voltage, current, and temperature during charging. The battery 296 stores or generates electricity and supplies power to the electronic device by using the stored or generated electricity. The battery 296 may include a rechargeable battery or a solar battery.

The indicator 297 indicates a specific state, such as a booting state, a message, or a charging state of the electronic device or a part thereof, such as the processor 210.

The motor 298 converts an electric signal into a mechanical vibration.

Alternatively, the electronic device includes a processing unit, such as a GPU, for supporting mobile TV, which processes media data according to a protocol, e.g., digital multimedia broadcasting (DMB), digital video broadcasting (DVB), and/or media flow.

Each of the aforementioned elements of the electronic device 201 may include one or more components, and the names thereof may vary depending on a type of the electronic device 201. Some of the elements illustrated in FIG. 2 may be omitted, and/or additional elements may be included therein. In addition, some of the elements of the electronic device 201 may be combined and constructed as a single entity, so as to equally perform functions of corresponding elements before combination.

At least some parts of the electronic device 201, such as modules or functions thereof, or operations, may be implemented with an instruction stored in a non-transitory computer-readable storage media. The instruction may be executed by the processor 210, to perform a function corresponding to the instruction. The non-transitory computer-readable storage media may be the memory 230. At least some parts of the programming module may be executed by the processor 210. At least some parts of the programming module may include modules, programs, routines, and a set of instructions for performing one or more functions.

According to various embodiments, in response to an interworking operation (e.g., a charging operation or a data exchange operation) with an electronic device having a cooling function (e.g., an electronic device 350 of FIG. 3), the processor 210 can detect an internal temperature of an external electronic device through the temperature sensor 240J in real time. According to an embodiment, based on a table regarding control commands stored in the memory 230 of the external electronic device, the processor 210 can send a particular control command corresponding to a current temperature, to the electronic device having the cooling function (e.g., the electronic device 350 of FIG. 3).

Figure 3:
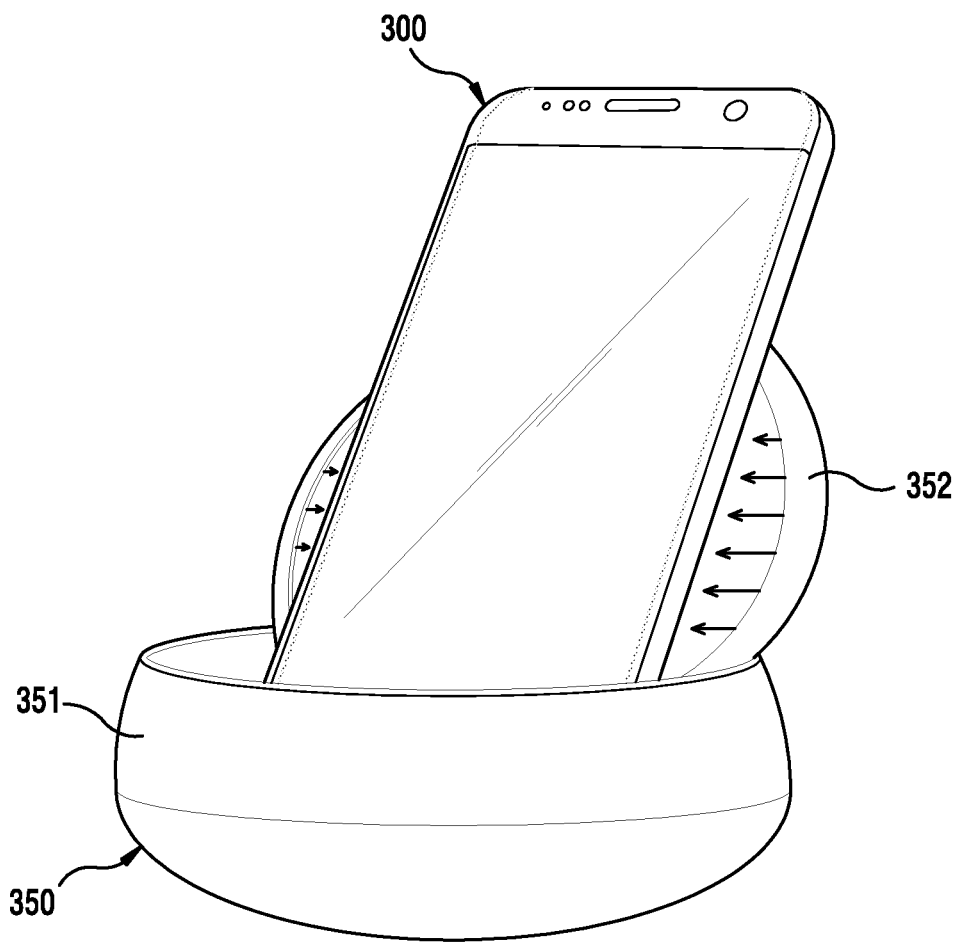
FIG. 3 is a diagram illustrating an external electronic device resting on an electronic device having a cooling function according to various embodiments of the present disclosure.

FIG. 3 is a diagram illustrating an example of an external electronic device resting on an electronic device having a cooling function according to various embodiments of the present disclosure.

An external electronic device 300 of FIG. 3 may be similar to the external electronic device 101 of FIG. 1 or the external electronic device 201 of FIG. 2, or include other embodiments of the electronic device.

Referring to FIG. 3, the external electronic device 300 may rest on an electronic device 350 having a cooling function (hereafter, referred to as an electronic device). According to an embodiment, the electronic device 350 may be used, for example, and without limitation, as a charging device which charges the external electronic device 300 by wire or wirelessly, as a hub device which exchanges data with another external electronic device, or as a device (e.g., for receiving and outputting an audio signal) for holding the external electronic device 300 (e.g., to play multimedia), or the like.

According to various embodiments, the electronic device 350 may include a first housing 351 disposed on a ground surface (e.g., a bottom surface), and a second housing 352 disposed at a specific angle based on the first housing 351. According to an embodiment, the second housing 352 may be integrally formed with the first housing 351, or attached to the first housing 351. According to an embodiment, at least part of the external electronic device 300 can be received in a region of the first housing 351 of the electronic device 350, and may rest at a specific angle based on the second housing 352. According to an embodiment, at least part of the second housing 352 may include a hollow portion, and the external electronic device 300 may be received in the hollow portion.

According to various embodiments, the external electronic device 300 may detect its resting in the electronic device 350. For example, the external electronic device 300 may rest in the electronic device 350 for the sake of, for example, and without limitation, charging, data exchange, or resting, or the like. According to an embodiment, in response to the resting, the external electronic device 300 may detect its internal temperature. According to an embodiment, the external electronic device 300 may send a control command corresponding to the detected temperature, to the electronic device 350.

According to various embodiments, the electronic device 350 may control an internal electric fan motor (e.g., an electric fan motor 630 of FIG. 6A) based on the control command received from the external electronic device 300. According to an embodiment, the control command can include voltage information for controlling the electric fan motor (e.g., the electric fan motor 630 of FIG. 6A) of the electronic device 350 according to the temperature of the external electronic device 300. According to an embodiment, the control command may include Revolutions Per Minute (RPM) information for controlling the electric fan motor (e.g., the electric fan motor 630 of FIG. 6A) of the electronic device 350 according to the temperature of the external electronic device 300. According to an embodiment, the electronic device 350 may control a level of a cooling air discharged from an inside of the second housing 352 toward the external electronic device 300, based on the control command received from the external electronic device 300.

In the following description, the external electronic device and the electronic device having the cooling function shall be described in greater detail.

Figure 4A:
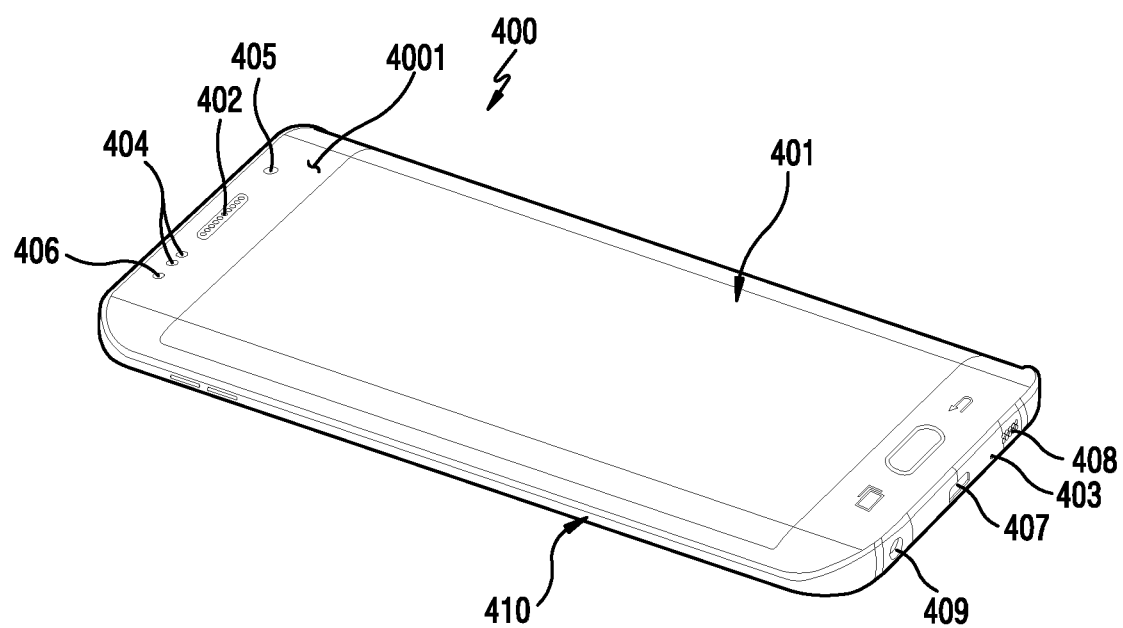
FIGS. 4A and 4B are perspective views illustrating a front side and a back side, respectively, of an external electronic device according to various embodiments of the present disclosure.
Figure 4B:
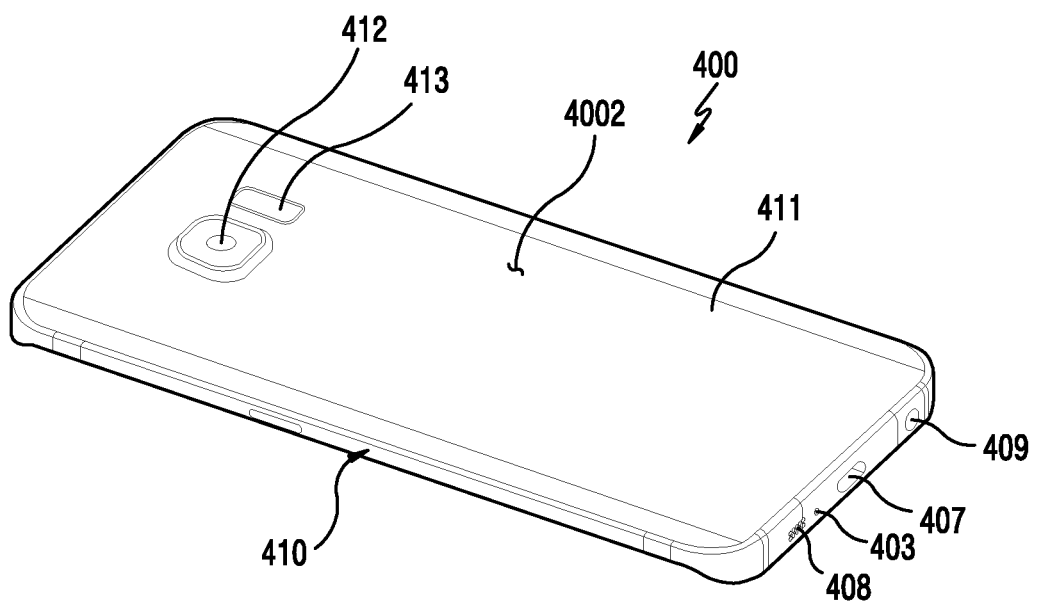

FIGS. 4A and 4B are perspective views illustrating a front side and a back side, respectively, of an external electronic device according to various embodiments of the present disclosure.

The external electronic device of FIGS. 4A and 4B may be similar to the external electronic device of FIG. 1, FIG. 2, or FIG. 3, or include another embodiment of the external electronic device.

Referring to FIGS. 4A and 4B, the external electronic device 400 may include a housing 410. According to an embodiment, the external electronic device 400 may include a display 401 disposed in a first side direction 4001 (e.g., a front side direction) of the housing 410. According to an embodiment, the display 401 may include a touch sensor and serve as a touch screen device. According to an embodiment, the display 401 may include a pressure sensor and serve a pressure-sensitive touch screen device. According to an embodiment, the external electronic device 400 may include a receiver 402 which is disposed to output a voice of other party. According to an embodiment, the external electronic device 400 may include a microphone device 403 disposed to send user's voice to the other party.

According to various embodiments, the external electronic device 400 may include components for performing various functions of the external electronic device 400, near the receiver 402. The components may include at least one sensor module 404. The sensor module 404 may include, for example, and without limitation, at least one of an illumination sensor (e.g., an optical sensor), a proximity sensor (e.g., an optical sensor), an infrared sensor, an ultrasonic sensor, a fingerprint scanning sensor, and an iris scanning sensor, or the like. According to an embodiment, the components may include a first camera device 405. According to an embodiment, the components may include an indicator 406 (e.g., a Light Emitting Diode (LED) device) which notifies status information of the external electronic device 400 to the user.

According to various embodiments, the external electronic device 400 may include a speaker device 408 disposed on one side of the microphone device 403. According to an embodiment, the external electronic device 400 may include an interface connector port 407 which is disposed on other side of the microphone device 403. The interface connector port 407 exchanges data with another external electronic device (e.g., the electronic device 350 having the cooling function of FIG. 3), and charges the external electronic device 400 by receiving external power. According to an embodiment, the external electronic device 400 may include an earjack hole 409 disposed on a side of the interface connector port 407.

According to various embodiments, the housing 410 may comprise a conductive material and/or a nonconductive material. According to an embodiment, the housing 410 may be disposed along edges of the external electronic device 400 and extend to part of a second side direction 4002 (e.g., a rear side direction) of the external electronic device 400 or to at least a portion of the first side direction 4001 which is opposite to the second side direction 4002. According to an embodiment, the housing 410 can be defined as, but not limited to, at least part of a thickness of the external electronic device 400 along the edges of the external electronic device 400, and formed in a closed-loop shape. The electronic device 410 may be formed as at least part of the thickness of the external electronic device 400. According to an embodiment, at least part of the housing 410 may be embedded in the external electronic device 400.

According to various embodiments, the external electronic device 400 may include a rear side housing 411 (e.g., a rear side cover) disposed in the second side direction 4002 (e.g., the rear side direction). According to an embodiment, the external electronic device 400 may include a second camera device 412 exposed through the rear side housing 411. According to an embodiment, the external electronic device 400 may include at least one electronic component 413 which is disposed on a side of the second camera device 412. According to an embodiment, the electronic component 413 may include, for example, and without limitation, at least one of an illumination sensor (e.g., optical sensor), a proximity sensor (e.g., optical sensor), an infrared sensor, an ultrasonic sensor, a heat rate monitor sensor, a flash device, and a fingerprint scanning sensor, or the like.

According to various embodiments, the external electronic device 400 may include, as a power supply means, a battery (not shown) (e.g., rigid type battery pack or pouch type battery cell) which is secured to the housing 410 inside the external electronic device 400.

According to various embodiments, when the external electronic device 400 rests in an electronic device having the cooling function (e.g., the electronic device 350 of FIG. 3), it may receive charging power or exchange data through the interface connector port 407.

According to various embodiments, when the external electronic device 400 rests in an electronic device having the cooling function (e.g., the electronic device 350 of FIG. 3), it may include a wireless power receiving member (e.g., a coil member) for receiving wireless charging power through a wireless power transmitting member of the electronic device having the cooling function (e.g., the electronic device 350 of FIG. 3). According to an embodiment, the external electronic device 400 may include a wireless communication circuit for, when the external electronic device 400 rests in the electronic device having the cooling function (e.g., the electronic device 350 of FIG. 3) and determines whether the resting is for the wireless charging, wirelessly communicating with the electronic device having the cooling function (e.g., the electronic device 350 of FIG. 3). According to an embodiment, the wireless communication circuit may include at least one antenna radiator for at least one short-range wireless communication of Bluetooth, Zigbee, and Wireless Fidelity (WiFi).

Figure 5A:
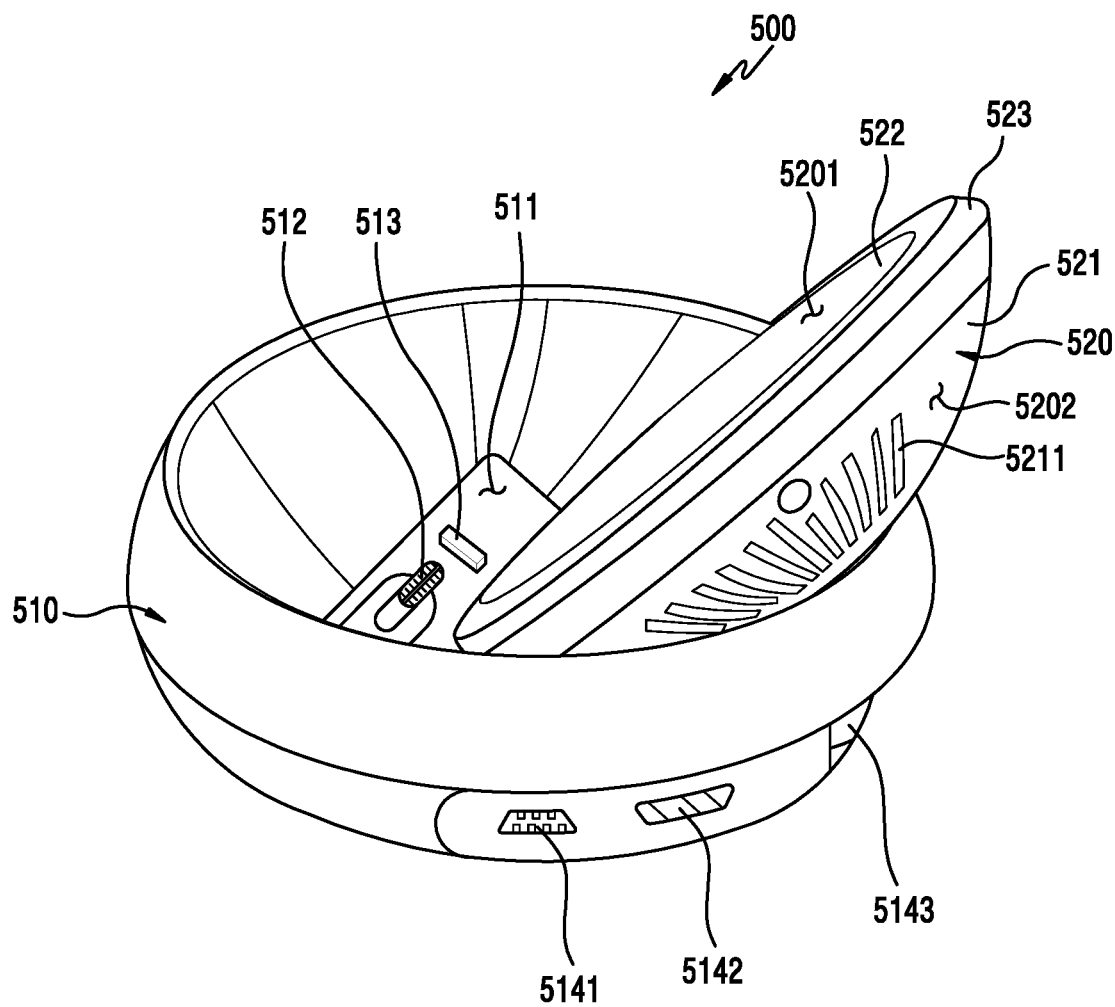
FIGS. 5A, 5B, and 5C are diagrams illustrating an example electronic device having a cooling function according to various embodiments of the present disclosure.
Figure 5B:
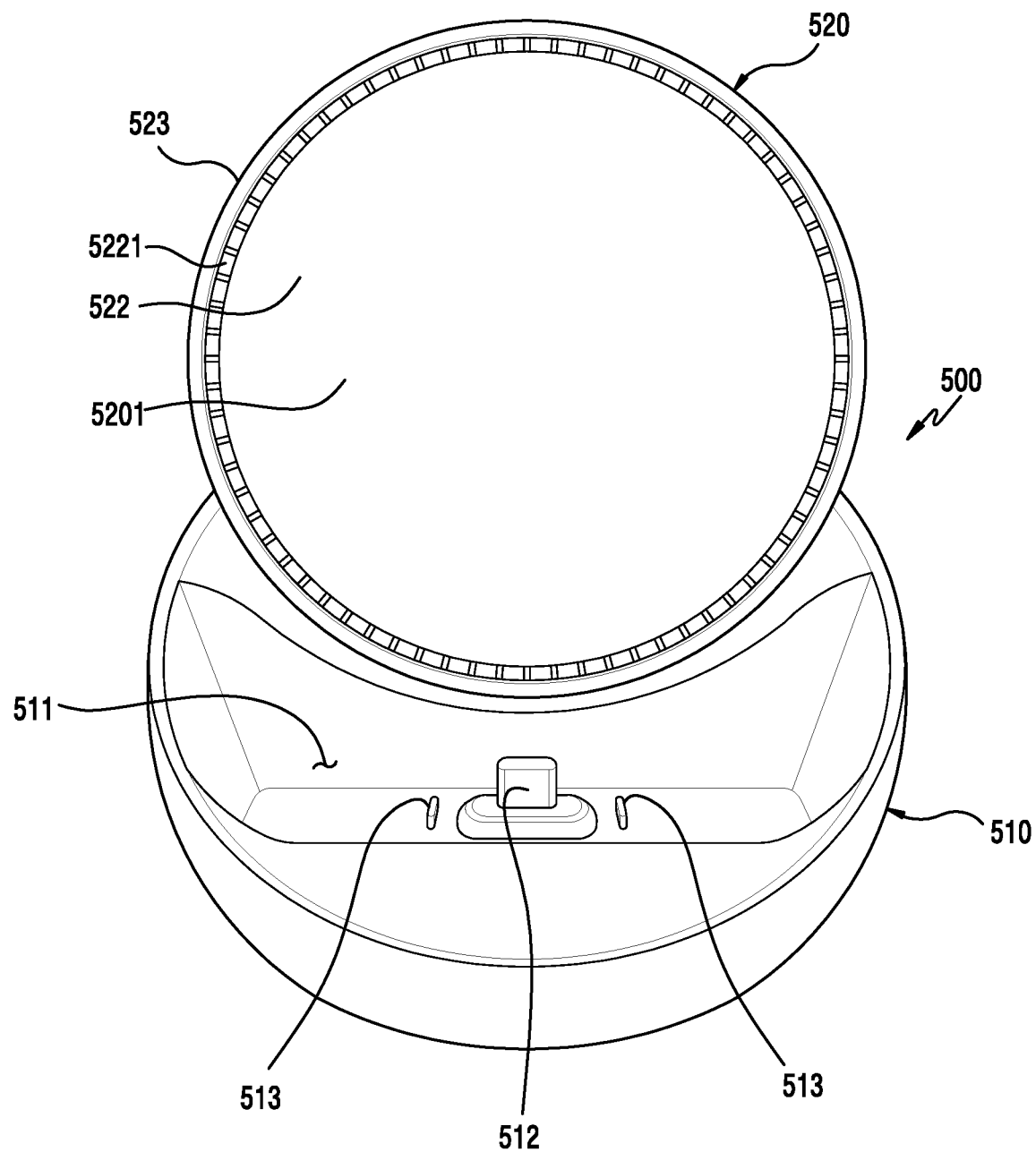
Figure 5C:
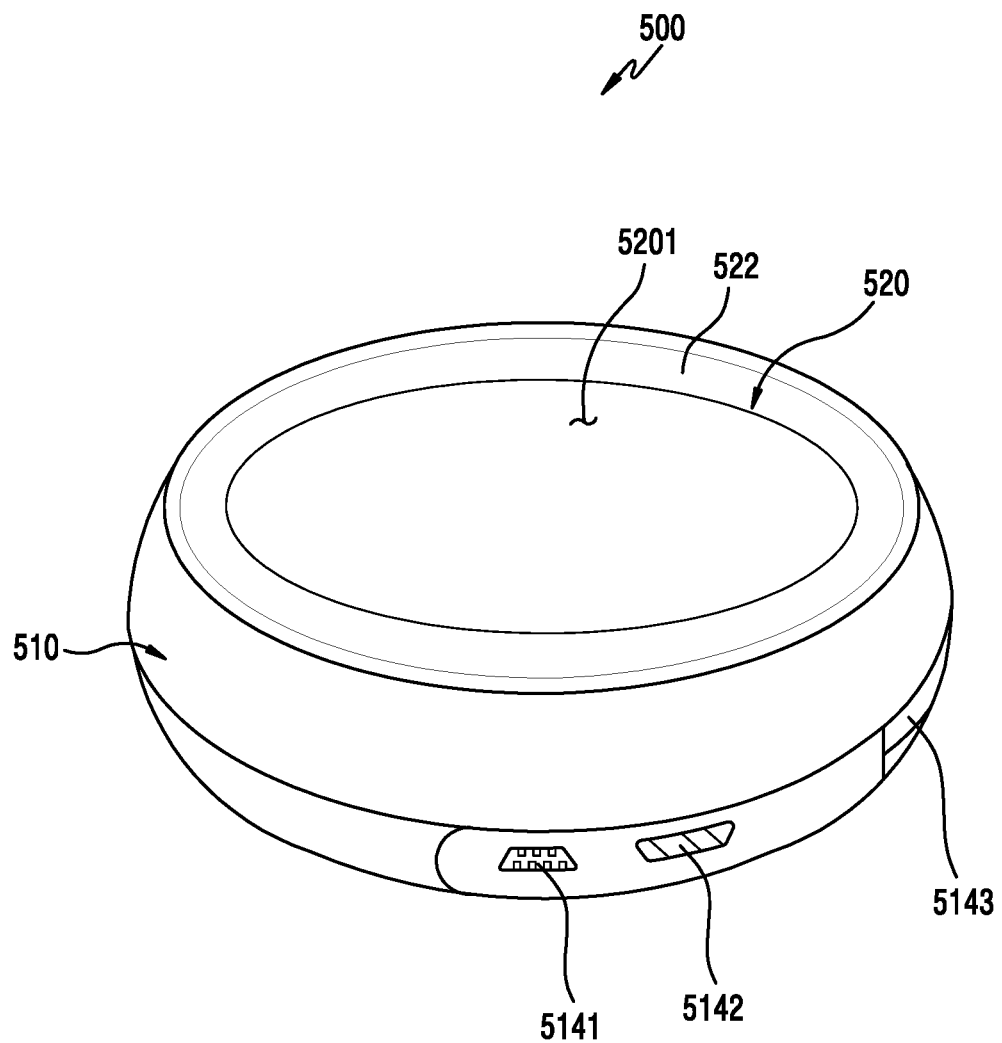

FIGS. 5A, 5B, and 5C are diagrams illustrating an example electronic device having a cooling function according to various embodiments of the present disclosure.

An electronic device 500 having the cooling function of FIGS. 5A, 5B, and 5C may be similar to the electronic device 350 having the cooling function of FIG. 3, or include another embodiment of the electronic device having the cooling function.

Referring to FIGS. 5A, 5B, and 5C, the electronic device 500 having the cooling function (hereafter, referred to as an electronic device) may include a first housing 510 arranged to lie on, for example, a ground (e.g., a bottom surface), and a second housing 520 disposed at a specific angle from the first housing 510. According to an embodiment, the first housing 510 may include a hollow portion (or recessed portion) 511 (e.g., a receiving portion) for receiving at least part of an external electronic device (e.g., the external electronic device 400 of FIG. 4A) and/or at least part of the second housing 520. According to an embodiment, the second housing 520 may be attached to the first housing 510. According to an embodiment, the second housing 520 may be disposed to slide in the first housing 510. In this case, as illustrated in FIG. 5C, the second housing 520 may be disposed to overlap the first housing 510 in parallel. According to an embodiment, the second housing 520 may be completely received in the hollow portion 511 of the first housing 510. According to an embodiment, when the second housing 520 may opened from the first housing 510, it may stay erected at a specific angle from the first housing 510. According to an embodiment, as illustrated in FIG. 5C, the external electronic device (e.g., the external electronic device 400 of FIG. 4A) can rest in parallel with the ground by use of a holding surface 5201 of the second housing 520 which is folded into the first housing 510. In this case, the external electronic device (e.g., the external electronic device 400 of FIG. 4A) can wirelessly receive the charging power through a wireless power transmitting member (e.g., a wireless power transmitting member 660 of FIG. 6A) of the electronic device 500. According to an embodiment, as illustrated in FIG. 5A and FIG. 5B, the external electronic device (e.g., the external electronic device 400 of FIG. 4A) may be mounted to be supported by the holding surface 5201 of the second housing 520 which is opened at the specific angle from the first housing 510. In this case, the external electronic device (e.g., the external electronic device 400 of FIG. 4A) can be electrically connected to the electronic device 500 through a connector 512.

According to various embodiments, when the external electronic device (e.g., the external electronic device 400 of FIG. 4A) rests in the hollow portion 511, the connector 512 for electrically connecting an interface connector port (e.g., the interface connector port 407 of FIG. 4A) of the external electronic device (e.g., the external electronic device 400 of FIG. 4A) may protrude. According to an embodiment, the hollow portion 511 may include a pair of support protrusions 513 which protrude across the connector 512. According to an embodiment, the support protrusions 513 may prevent and/or reduce horizontal movement of the external electronic device (e.g., the external electronic device 400 of FIG. 4A) resting in the hollow portion 511 of the first housing 510, and support smooth electrical connection. According to an embodiment, at least one interface connector port 5141, 5142, and/or 5143 may be exposed at an adequate position on an outer surface of the first housing 510. According to an embodiment, the interface connector port 5141, 5142, and/or 5143 can be shaped for the electrical connection with other external electronic device. According to an embodiment, the at least one interface connector port 5141, 5142, and/or 5143 may include, for example, and without limitation, an HDMI, a USB, an optical interface, a Digital Visual Interface (DVI), a Display Port (DP), or a D-sub port, or the like. According to an embodiment, the other external electronic device can include a display, a keyboard, a mouse, a speaker, or a charging adaptor, or the like.

According to various embodiments, the second housing 520 may include a first cover 521 including a plurality of first openings 5211 on a rear side 5202, a holding surface 5201 coupled with the first cover 521 for the external electronic device (e.g., the external electronic device 400 of FIG. 4A), and a second cover 522 including a second opening 5221. According to an embodiment, the first openings 5211 may serve as an air inlet for flowing external air into the second housing 520. According to an embodiment, the second opening 5221 may serve as an air outlet for discharging the internal air of the second housing 520. According to an embodiment, the second opening 5221 may be formed according to a structural shape of the second cover 522. According to an embodiment, the second opening 5221 may be formed by, but not limited to, a coupling shape of the second cover 522 and a separate auxiliary cover 523. The second opening 5221 may be formed by a coupling shape of the second cover 522 and the first cover 521.

Figure 6A:
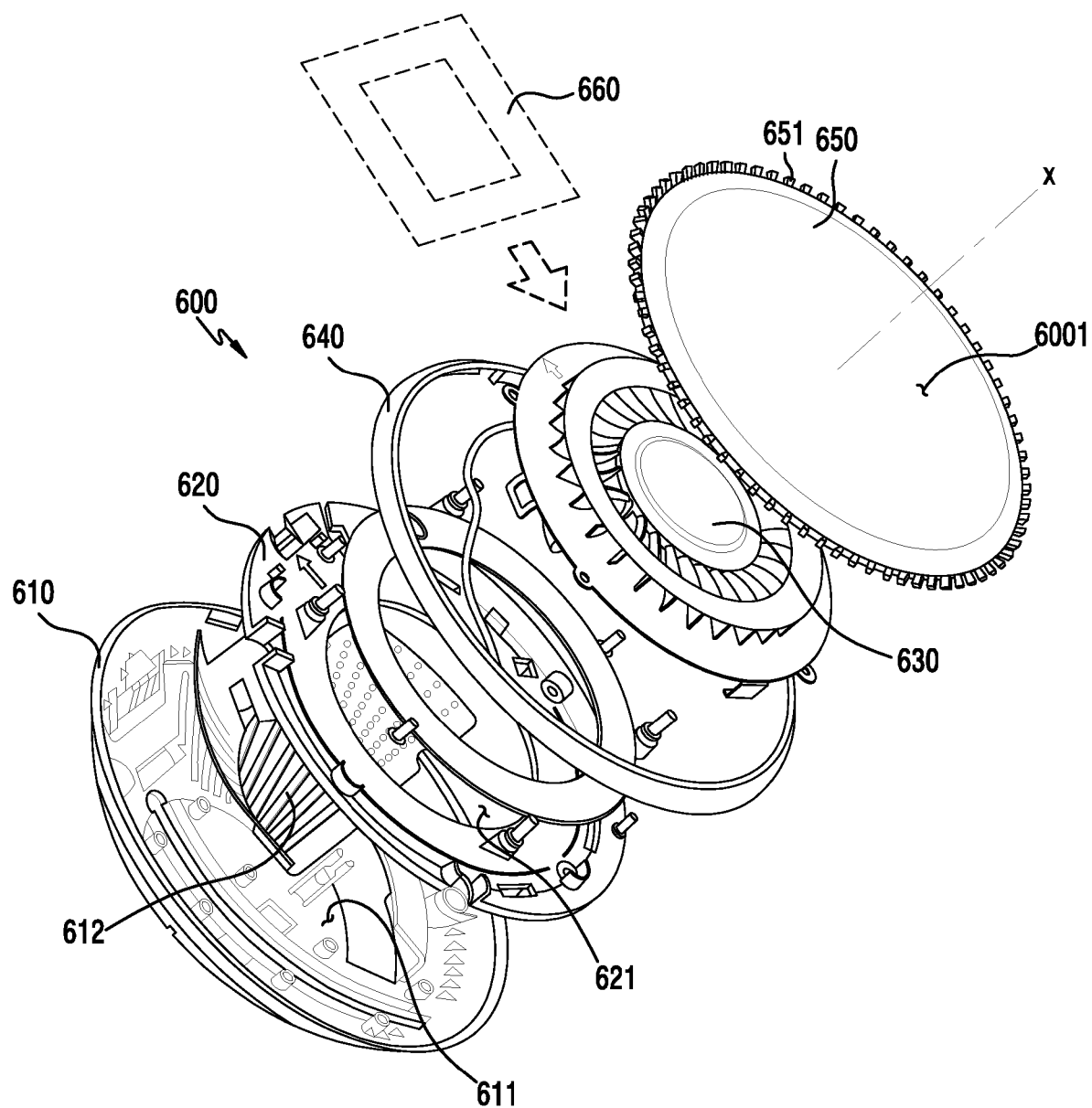
FIG. 6A is an exploded view illustrating a second housing of an electronic device having a cooling function according to various embodiments of the present disclosure.

According to various embodiments, the electronic device 500 may receive a control command of the external electronic device (e.g., the external electronic device 400 of FIG. 4A) and thus drive an internal electric fan motor (e.g., an electric fan motor 630 of FIG. 6A). According to an embodiment, the electronic device 500 may suck the external air from the first opening 5211 of the first cover 521 based on the driving of the electric fan motor (e.g., the electric fan motor 630 of FIG. 6A), and discharge the air to the second opening 5221 of the second cover 522. According to an embodiment, due to the shape of the second opening 5221, the discharged air may head toward the external electronic device (e.g., the external electronic device 400 of FIG. 4A) resting on the holding surface 5201 of the second cover 522.

FIG. 6A is an exploded perspective view of illustrating a second housing of an electronic device having a cooling function according to various embodiments of the present disclosure.

The second housing 600 of FIG. 6A may be similar to the second housing 352 of FIG. 3 or the second housing 520 of FIG. 5A, or can include another embodiment of the second housing.

According to various embodiments, the second housing 600 may include a first cover 610 (e.g., the first cover 521 of FIG. 5A), a support plate 620 and an electric fan motor 630 which are sequentially disposed inside the first cover 610, a second cover 650 (e.g., the second cover 522 of FIG. 5A), and an auxiliary cover 640 (e.g., the auxiliary cover 523 of FIG. 5A).

According to various embodiments, the first cover 610 may include a plurality of first openings 612 for sucking external air in. According to an embodiment, the support plate 620 may include an opening 621 of a specific diameter that may be disposed at its center in an inner space 611 of the first cover 610. According to an embodiment, the support plate 620 may be secured using, for example, and without limitation, screw fastening, mechanical structure coupling, bonding coupling, or ultrasonic welding, or the like, with the first cover 610.

According to various embodiments, the electric fan motor 630 may be secured to, for example, but not limited to, the support plate 620. The electric fan motor 630 may be secured directly to the first cover 610, without the support plate 620. According to an embodiment, the electric fan motor 630 includes fans (e.g., blades), and may guide the air flowing into the first opening 612 to a second opening (e.g., a second opening 6501 of FIG. 6B) according to rotation of the fan.

According to various embodiments, the second cover 650 including a holding surface 6001 may be coupled with the first cover 610 through the auxiliary cover 640. According to an embodiment, the second cover 650 may include a plurality of air guides 651 disposed at specific intervals along edges. According to an embodiment, the air guides 651 may be coupled with the auxiliary cover 640, and spaces between the air guides 651 may define a plurality of second openings (e.g., the second opening 6501 of FIG. 6B). The present disclosure is not limited to this embodiment, and the structural joining of the first cover 610 and the air guide 651 of the second cover 650 may define the second opening. Alternatively, the second cover 650 may include a single housing including the auxiliary cover 640 and a hole in a portion of the second cover 650, and thus the second opening may be defined.

According to various embodiments, the second housing 600 may include a wireless power transmitting member 660 disposed between the second cover 650 and the electric fan motor 630. In this case, an electronic device having a cooling function (e.g., the electronic device 500 of FIG. 5A) including the second housing 600 may wirelessly charge an external electronic device (e.g., the external electronic device 300 of FIG. 3). According to an embodiment, the electronic device having the cooling function (e.g., the electronic device 500 of FIG. 5A) may include, but is not limited to, a connector (e.g., the connector 512 of FIG. 5A) for electrically connecting to the external electronic device (e.g., the external electronic device 300 of FIG. 3), and a wireless power transmitting member 660. The electronic device having the cooling function (e.g., the electronic device 500 of FIG. 5A) may include one of the connector (e.g., the connector 512 of FIG. 5A) and the wireless power transmitting member 660.

Figure 6B:
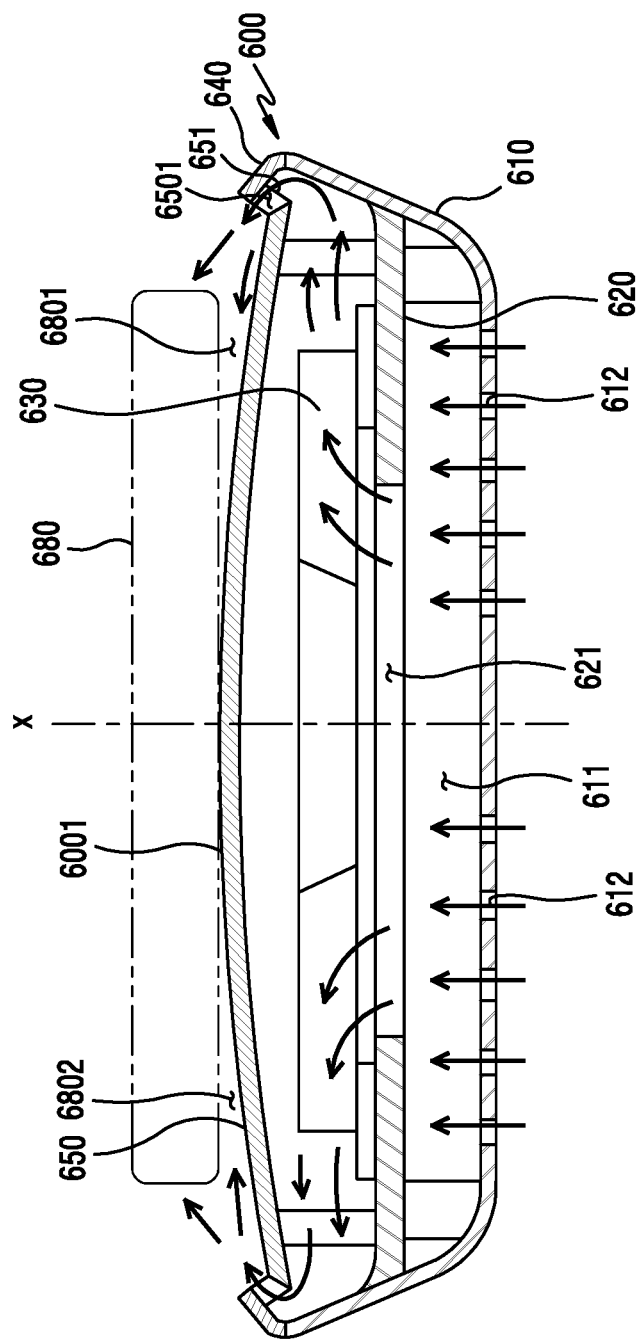
FIG. 6B is a cross-sectional view of the second housing of FIG. 6A, which is assembled, according to various embodiments of the present disclosure.

FIG. 6B is a cross-sectional view of the second housing of FIG. 6A, which is assembled, according to various embodiments of the present disclosure.

Referring to FIG. 6B, the support plate 620 may be secured in the inner space 611 of the first cover 610. According to an embodiment, the electric fan motor 630 may be secured to the support plate 620. According to an embodiment, the second cover 650 may be coupled with the first cover 610 through the auxiliary cover 640. According to an embodiment, edges of the auxiliary cover 640 contact the air guides 651 which are disposed at regular intervals along the edges of the second cover, and thus the spaces between the air guides 651 can be defined as the second opening 6501.

According to various embodiments, the electric fan motor 630 may be driven based on a control command received from the external electronic device (e.g., the external electronic device 300 of FIG. 3) resting on the holding surface 6001 of the first cover 610. According to an embodiment, based on the driving of the electric fan motor 630, the external air may flow into the inner space 611 of the second housing 600 through the first openings 612 of the first cover 610. According to an embodiment, the air flowing into the second housing 600 may be discharged by the electric fan motor 630 through the second opening 6501 which is formed by the air guide 651 of the second cover 650 and the auxiliary cover 640. According to an embodiment, the air discharged through the second opening 6501 may head toward an external electronic device 680 which is resting on the holding surface 6001, according to the shape of the second opening 6501 of the second housing 650. According to an embodiment, the discharged air may head toward the external electronic device (e.g., the external electronic device 300 of FIG. 3) resting on the holding surface 6001, according to the shape of the air guide 651 which defines the second opening 6501. According to an embodiment, the air discharged through the second opening 6501 may change in direction according to the shape of the auxiliary cover 640. According to an embodiment, the air discharged through the second opening 6501 may change in direction according to the shape (e.g., edges bend toward the holding surface) of the auxiliary cover 640 which is adjacent to the second opening 6501.

According to various embodiments, the holding surface 6001 of the second cover 650 may protrude and curve outward in order to effectively cool the external electronic device (e.g., the external electronic device 300 of FIG. 3) with the discharged air from the second opening 6501. According to an embodiment, the holding surface 6001 may protrude most at the center and curve while declining toward its rim. Hence, the external electronic device (e.g., the external electronic device 300 of FIG. 3) resting on the holding surface 6001 may contact substantially the most protruding center portion of the holding surface 6001 and create spaces 6801 and 6802 in remaining portions, and the discharged air may be sucked into the spaces 6801 and 6802 and the external electronic device 680 may be effectively cooled.

Figure 7A:
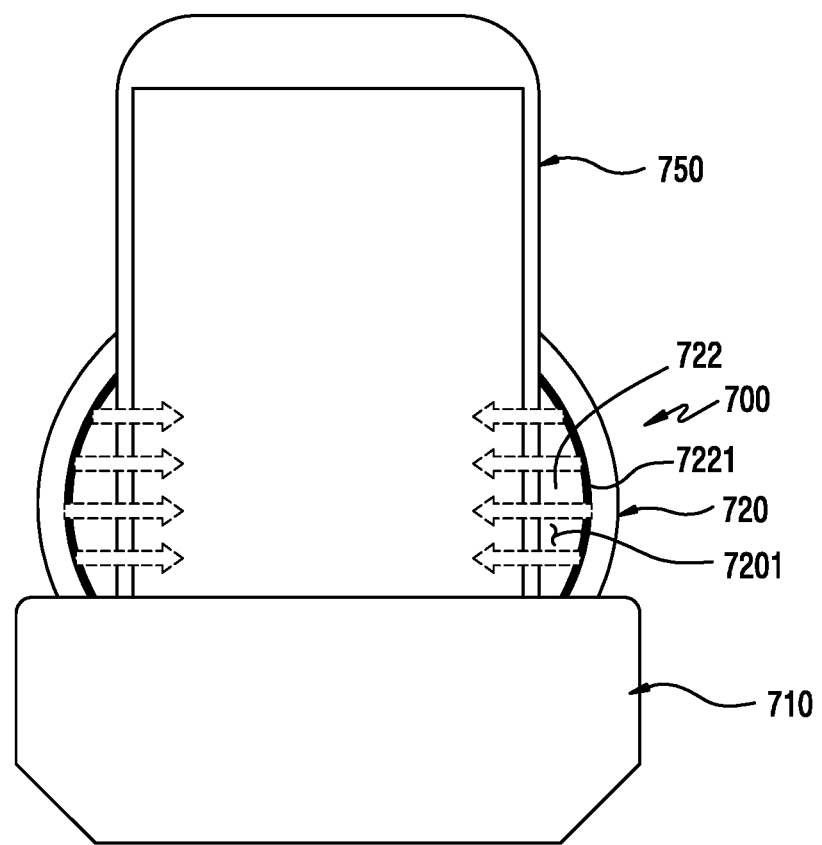
FIGS. 7A, 7B, and 7C are diagrams illustrating an example of air flow discharged through an electronic device having a cooling function according to various embodiments of the present disclosure.
Figure 7B:
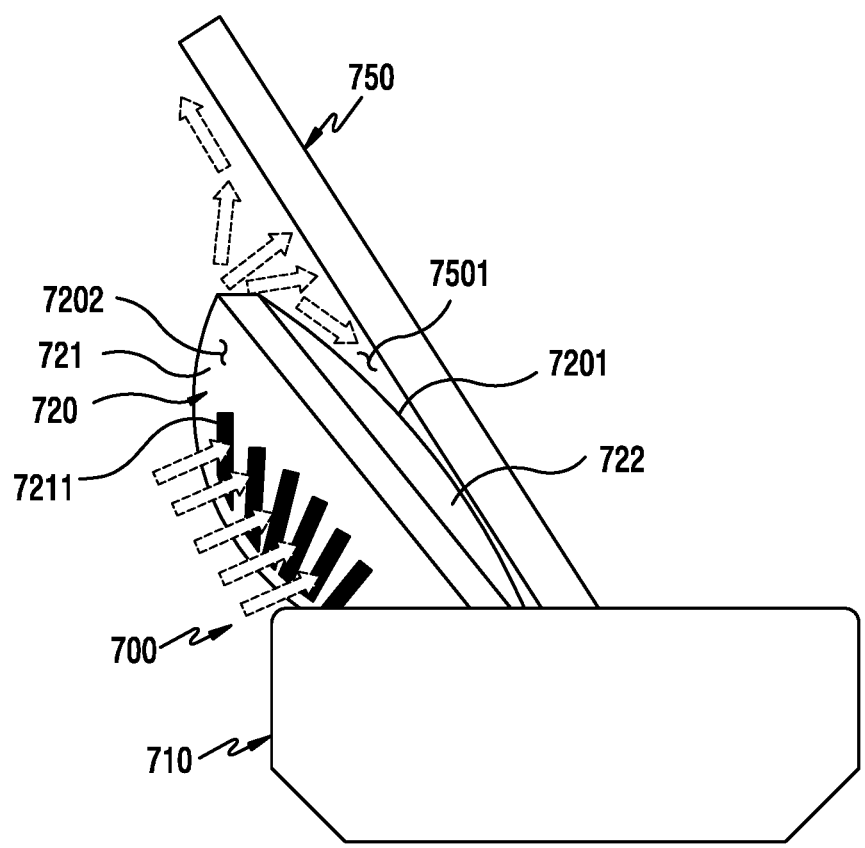
Figure 7C:
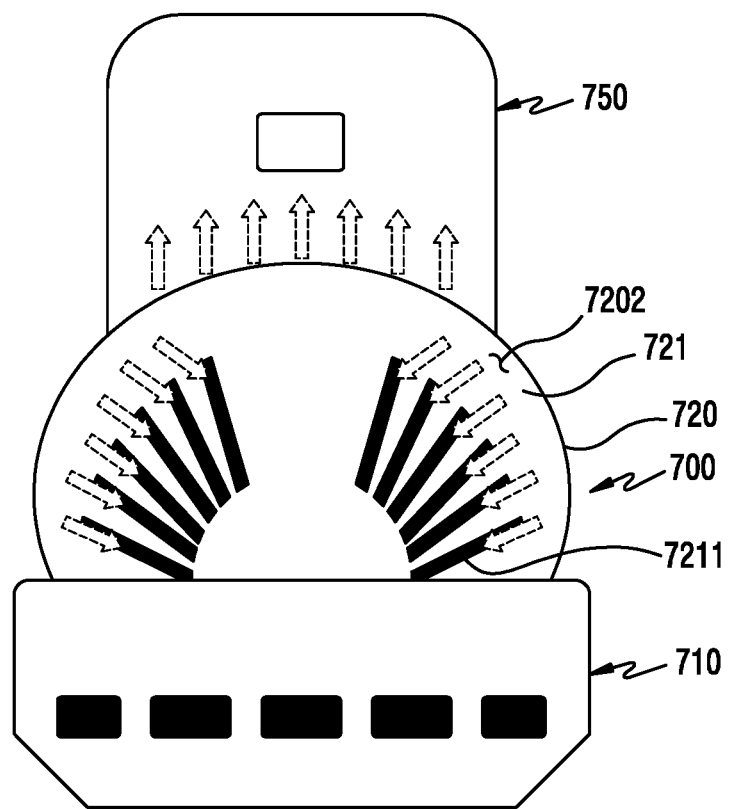

FIGS. 7A, 7B, and 7C are diagrams illustrating examples of air flow discharged through an electronic device having a cooling function according to various embodiments of the present disclosure.

An electronic device 700 having the cooling function of FIGS. 7A, 7B, and 7C can be similar to the electronic device 350 having the cooling function of FIG. 3 or the electronic device 500 having the cooling function of FIG. 5, or may be directed to another embodiment of the electronic device having the cooling function.

FIGS. 7A, 7B, and 7C are diagrams of the air flow, when viewed from various directions, for cooling an external electronic device resting in the electronic device having the cooling function.

Referring to FIGS. 7A, 7B, and 7C, an external electronic device 750 (e.g., the external electronic device 300 of FIG. 3) may rest in an electronic device 700 having the cooling function (e.g., the electronic device 350 of FIG. 3) (hereafter, referred to as an electronic device) for the sake of, for example, and without limitation, charging, data exchange, or resting, or the like. According to an embodiment, the external electronic device 750 can rest to be supported by a second housing 720 which is disposed at a specific angle from a first housing 710 of the electronic device 700. According to an embodiment, the electronic device 700 may drive an internal electric fan motor (e.g., the electric fan motor 630 of FIG. 6A) based on a control command received from the external electronic device 750. According to an embodiment, driving of the electric fan motor (e.g., the electric fan motor 630 of FIG. 6A) may suck external air into an inner space of the second housing 720 through first openings 7211 of a first cover 721 which is defined as a rear side 7202 of the second housing 720. According to an embodiment, the electric fan motor (e.g., the electric fan motor 630 of FIG. 6A) may discharge the air flowing into the second housing 720 through second openings 7221 (e.g., the second openings 6501 of FIG. 6B) disposed at edges of a holding surface 7201 of the second cover 722.

According to various embodiments, the holding surface 7201 of the second cover 722 may protrude and bend outward in order to effectively cool the external electronic device 750 (e.g., the external electronic device 300 of FIG. 3) with the discharged air from the second openings 7221. According to an embodiment, the external electronic device 750 resting on the holding surface 7201 may contact substantially the most protruding center portion of the holding surface 7201 and create a space 7501 in remaining portions. According to an embodiment, the discharged air from the second openings 7221 may flow into the space 7501 and thus cool the external electronic device 750 in three dimensions.

Figure 8A:
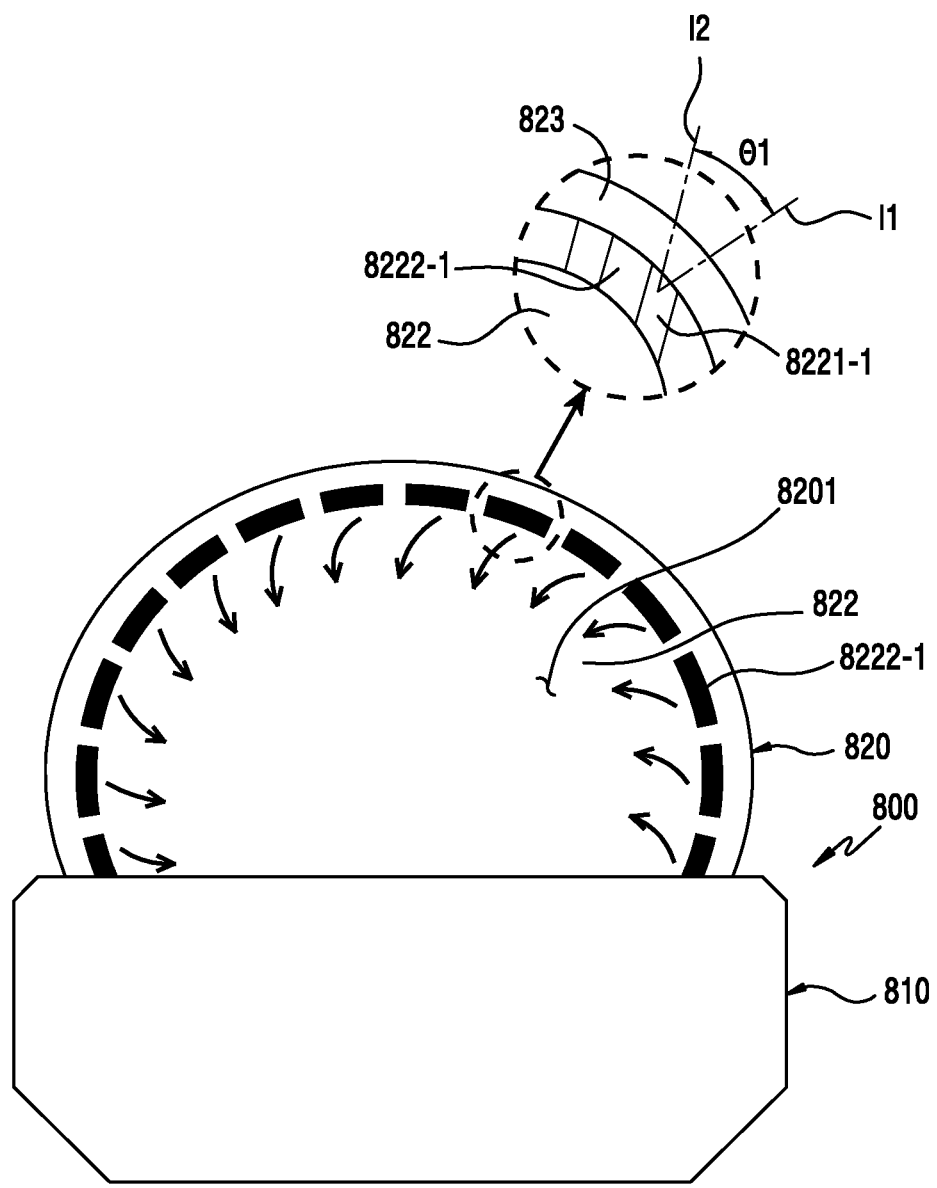
FIGS. 8A and 8B are diagrams illustrating an example structure for controlling a discharged air direction in an electronic device having a cooling function according to various embodiments of the present disclosure.
Figure 8B:
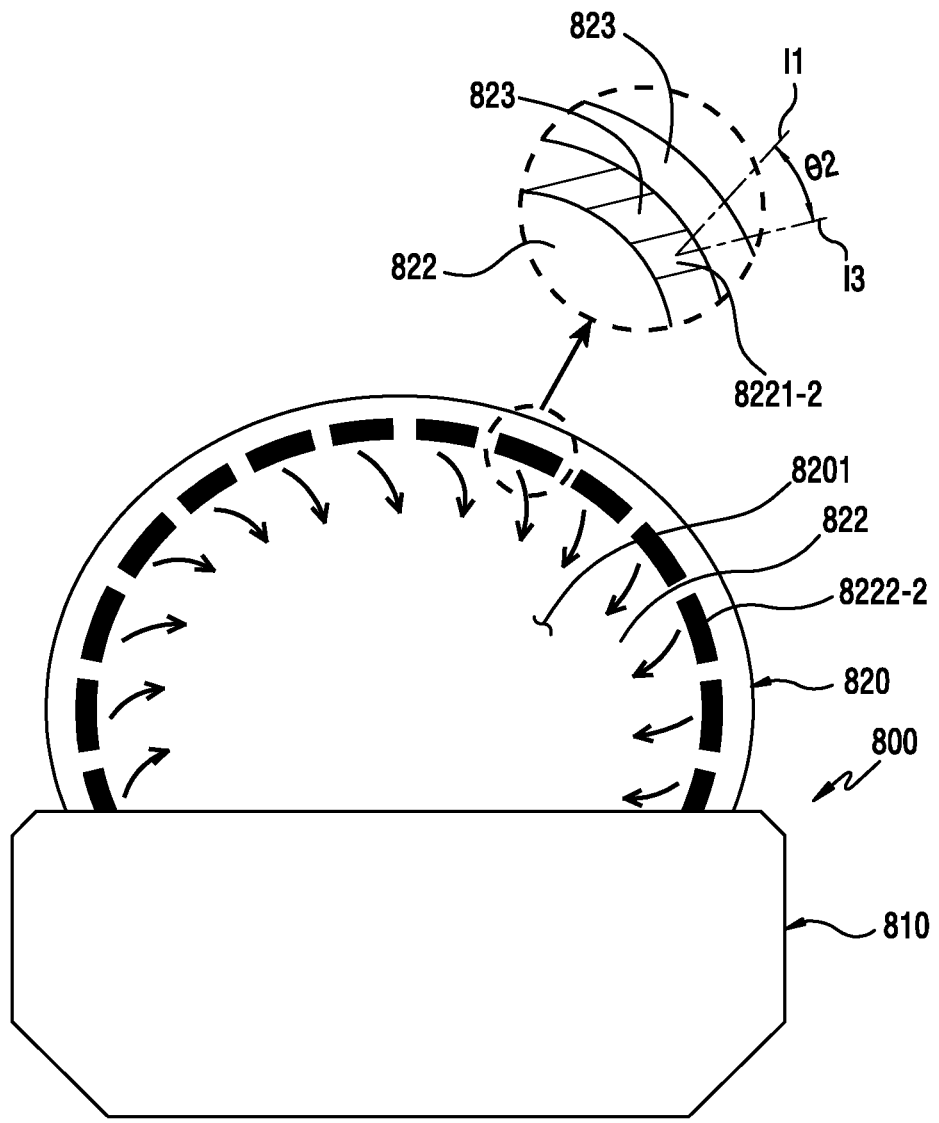

FIGS. 8A and 8B are diagrams illustrating an example structure for controlling a discharged air direction in an electronic device having a cooling function according to various embodiments of the present disclosure.

An electronic device 800 having the cooling function of FIGS. 8A and 8B may be similar to the electronic device 350 having the cooling function of FIG. 3, the electronic device 500 having the cooling function of FIG. 5A, or the electronic device 700 having the cooling function of FIG. 7A, or may be directed to another embodiment of the electronic device having the cooling function.

Referring to FIG. 8A, the electronic device 800 having the cooling function (e.g., the electronic device 350 of FIG. 3) (hereafter, referred to as an electronic device) may include a first housing 810 and a second housing 820 which is disposed at a specific angle from the first housing 810. According to an embodiment, the second housing 820 may include a plurality of second openings 8222-1 disposed along edges of a second cover 822. According to an embodiment, when an external electronic device (e.g., the external electronic device 300 of FIG. 3) rests on a holding surface 8201 of the second housing 820, the electronic device 800 may receive a control command from the external electronic device (e.g., the external electronic device 300 of FIG. 3) and thus drive an internal electric fan motor (e.g., the electric fan motor 630 of FIG. 6). According to an embodiment, the driving of the electric fan motor (e.g., the electric fan motor 630 of FIG. 6) can suck external air into the second housing 820 and then discharge the air toward the external electronic device (e.g., the external electronic device 300 of FIG. 3) through the second openings 8222-1.

According to various embodiments, the direction of the air discharged through the second openings 8222-1 can change according to coupling of air guides 8221-1 disposed at regular intervals along the edges of the second cover 822, and an auxiliary cover 823. According to an embodiment, the air may be discharged through the second openings 8222-1 counterclockwise toward the external electronic device as illustrated in FIG. 8A. According to an embodiment, the air discharged from the second openings 8222-1 may change the discharge direction to the counterclockwise direction due to the air guides 8221-1 disposed in parallel with a line 12 which is inclined counterclockwise at a specific angle θ1 from a line 11 which crosses a center of the second cover 822 at the edges of the second cover 822.

As illustrated in FIG. 8B, the air may be discharged from the second openings 8222-2 clockwise toward the external electronic device according to the coupling of the air guides 8221-2 disposed at regular intervals along the edges of the second cover 822, and the auxiliary cover 823. According to an embodiment, the air discharged from the second opening 8222-2 may change the discharge direction to the clockwise direction due to the air guides 8221-2 disposed in parallel with a line 13 which is inclined clockwise at a specific angle θ2 from the line 11 which crosses the center of the second cover 822 at the edges of the second cover 822.

According to various embodiments, the direction of the air flow discharged through the second openings 8222-1 and 8222-2 may head various directions based on the complex shape of the air guides 8221-1 and the 8221-2. For example, the air discharged through the second openings 8222-1 and 8222-2 may determine the direction to focus on the external electronic device (e.g., the external electronic device 300 of FIG. 3) by complexly changing the shape of the air guides 8221-1 and 8221-2 based on a holding style (e.g., horizontal mode holding style or vertical mode holding style) of the external electronic device (e.g., the external electronic device 300 of FIG. 3).

According to various embodiments, the electronic device having the cooling function may operate independently from the external electronic device. For example, the electronic device having the cooling function can include a control circuit (e.g., a processor). According to an embodiment, the electronic device having the cooling function may directly detect environment information (e.g., temperature) of the external electronic device which is resting, and directly control the electric fan motor based on a table regarding control commands stored in an internal memory.

According to various embodiments, the electronic device having the cooling function may interwork with the external electronic device only in some functions. According to an embodiment, the electronic device having the cooling function may include a control circuit (e.g., a processor). According to an embodiment, the electronic device having the cooling function may receive monitored environment information (e.g., temperature information) from the resting external electronic device, and directly control the electric fan motor based on the table regarding control commands stored in the memory therein.

Figure 9:
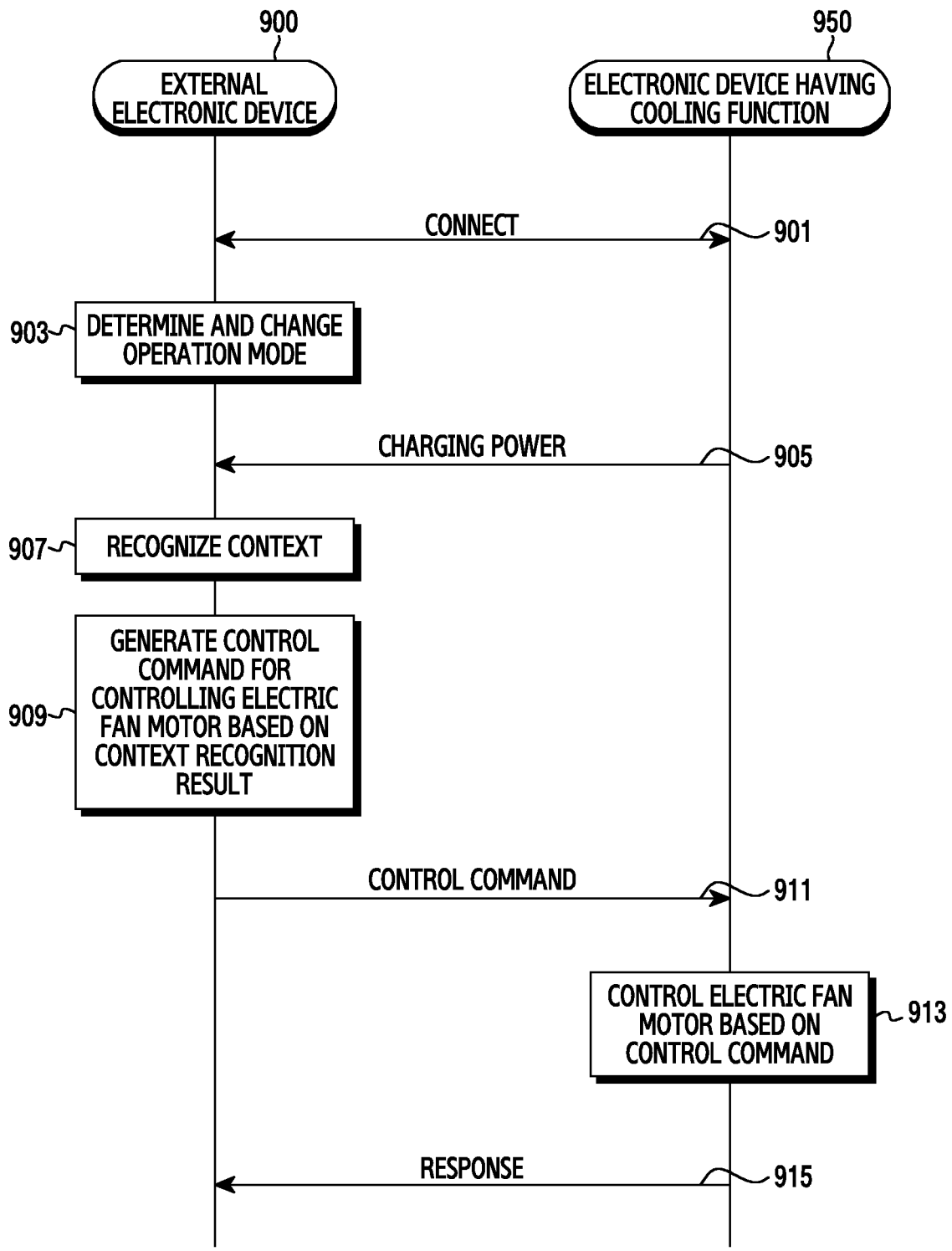
FIG. 9 is a sequence diagram illustrating an example of controlling operations between an external electronic device and an electronic device having a cooling function according to various embodiments of the present disclosure.

FIG. 9 is a sequence diagram illustrating an example of controlling operations between an external electronic device and an electronic device having a cooling function according to various embodiments of the present disclosure.

Referring to FIG. 9, in operation 901, an external electronic device 900 (e.g., the external electronic device 300 of FIG. 3) and an electronic device 950 having a cooling function (e.g., the electronic device 350 of FIG. 3) (hereafter, referred to as an electronic device) can be connected. According to an embodiment, the external electronic device 900 may be connected to the electronic device 950 merely by resting on the electronic device 950. According to an embodiment, the external electronic device 900 may be connected to a connector (the connector 512 of FIG. 5A) (e.g., a type C USB connector) of the electronic device (e.g., the electronic device 500 of FIG. 5A) for the sake of charging or data exchange. According to an embodiment, the external electronic device 900 may determine the resting by detecting wireless power received from the electronic device 950 for the charging, and connect to the electronic device 950 using short-range wireless communication.

In operation 903, the external electronic device 900 may determine and change an operation mode. According to an embodiment, the external electronic device 900 can be connected to the electronic device 950, and then determine or change the operation mode to an internal temperature detection mode. According to an embodiment, the external electronic device 900 can detect an internal temperature using a temperature sensor (e.g., the sensor mode 240J of FIG. 2) at specific time intervals or in real time.

In operation 905, the external electronic device 900 may receive charging power from the electronic device 950. According to an embodiment, the external electronic device 900 can receive the charging power through the connector (e.g., the connector 512 of FIG. 5A) of the electronic device (e.g., the electronic device 500 of FIG. 5A). According to an embodiment, the external electronic device 900 may receive the charging power wirelessly from a wireless power transmitting member (e.g., the wireless power transmitting member 660 of FIG. 6A) of the electronic device 950.

In operation 907, the external electronic device 900 may recognize context. According to an embodiment, the external electronic device 900 may perform context awareness about at least part of the charging power supplied from the electronic device 950, a function (or application) executed by the electronic device 900, or the temperature of the external electronic device 900. According to an embodiment, the external electronic device 900 may determine its state by monitoring (or tracking or sensing) various context information including, for example, and without limitation, dynamic, individual, or static context of the external electronic device 900 or its surrounding environment, or the like.

In operation 909, the external electronic device 900 may generate a control command for controlling an electric fan motor (e.g., the electric fan motor 630 of FIG. 6A) of the electronic device 950, based on the above-stated context awareness. According to an embodiment, the electronic device 900 can generate the control command, based on temperature information which is detected as a result of the context awareness.

In operation 911, the external electronic device 900 may send the generated control command to the electronic device 950. According to an embodiment, the electronic device (e.g., the electronic device 500 of FIG. 5A) may receive the control command through the connector (e.g., the connector 512 of FIG. 5A). Alternatively, the electronic device 950 may receive the control command through the short-range wireless communication.

In operation 913, the electronic device 950 may control its internal electric fan motor (e.g., the electric fan motor 630 of FIG. 6A) based on the control command received from the external electronic device 900. According to an embodiment, the electronic device 950 can drive the fan, turn off the fan, or change an RPM of the fan, according to the control command.

In operation 915, the electronic device 950 may send a response (e.g., Acknowledgement (ACK)) for the control of the electric fan motor (e.g., the electric fan motor 630 of FIG. 6A), to the external electronic device 900. According to an embodiment, operation 915 can be determined according to the control command of the external electronic device 900, and accordingly a separate response may not be transmitted.

Figure 10:
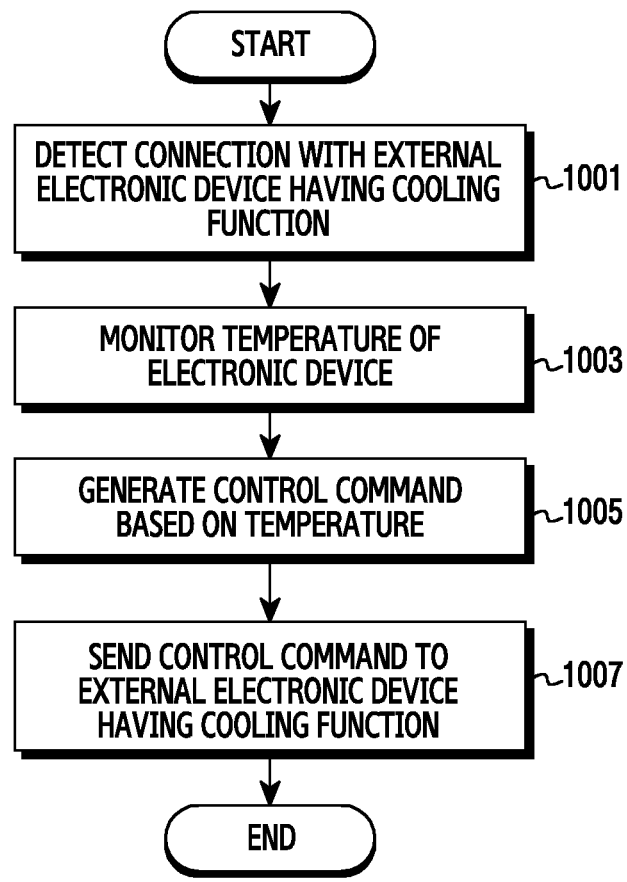
FIG. 10 is a flowchart illustrating an example method of operating an electronic device according to various embodiments of the present disclosure.

FIG. 10 is a flowchart illustrating an example method of operating an electronic device according to various embodiments of the present disclosure.

In operation 1001, the electronic device (e.g., the external electronic device 300 of FIG. 3) may detect connection to an electronic device having a cooling function (e.g., the electronic device 350 of FIG. 3) (hereafter, referred to as an external electronic device). According to an embodiment, when the electronic device (e.g., the external electronic device 300 of FIG. 3) rests on the external electronic device (e.g., the external electronic device 500 of FIG. 5A), it may be physically connected to a connector (e.g., the connector 512 of FIG. 5A) of the external electronic device (e.g., the external electronic device 500 of FIG. 5A). According to an embodiment, the electronic device (e.g., the external electronic device 300 of FIG. 3) may determine the resting of the external electronic device (e.g., the external electronic device 500 of FIG. 5A) in response to wireless charging power received from the external electronic device (e.g., the external electronic device 500 of FIG. 5A), and may be connected to the external electronic device using short-range wireless communication.

In operation 1003, upon detecting the connection to the external electronic device (e.g., the external electronic device 500 of FIG. 5A), the electronic device (e.g., the external electronic device 300 of FIG. 3) can monitor an internal temperature of the electronic device. According to an embodiment, the electronic device (e.g., the external electronic device 300 of FIG. 3) can monitor the internal temperature in real time or on a periodic basis.

In response to the detected temperature, the electronic device (e.g., the external electronic device 300 of FIG. 3) may generate a control command for controlling the electric fan motor (e.g., the electric fan motor 630 of FIG. 6A) of the external electronic device (e.g., the electronic device 500 of FIG. 5A) in operation 1005. According to an embodiment, based on the detected temperature range, the electronic device (e.g., the external electronic device 300 of FIG. 3) can generate the control command for turning off the electric fan motor (e.g., the electric fan motor 630 of FIG. 6A) or controlling a driving level.

In operation 1007, the electronic device (e.g., the external electronic device 300 of FIG. 3) may send a particular control command for the currently monitored temperature based on a table regarding control commands per temperature stored in a memory (e.g., the memory 230 of FIG. 2), to the external electronic device (e.g., the external electronic device 500 of FIG. 5A).

TABLE 1

| | monitoring temperature | | |
|---|---|---|---|
| | below 36° C. | 36° C.~38° C. | exceeds 38° C. |
| first control command (voltage) | OFF | 2.8 V | 4.6 V |

TABLE 1-continued

| | monitoring temperature | | |
|---|---|---|---|
| | below 36° C. | 36° C.~38° C. | exceeds 38° C. |
| second cotrol command (RPM) | OFF | 1800 RPM | 2600 RPM |
| state of the eletric fan motor | OFF | ON (low speed) | ON (high speed) |

According to various embodiments, as shown in Table 1, when the detected internal temperature is below 36☐, the electronic device (e.g., the external electronic device 300 of FIG. 3) may send a control command for not driving the electric fan motor (e.g., the electric fan motor 630 of FIG. 6A), to the external electronic device (e.g., the electronic device 350 of FIG. 3), based on the table regarding voltage information. According to an embodiment, when the detected internal temperature exceeds 36° C. and falls below 38° C., the electronic device (e.g., the external electronic device 300 of FIG. 3) may send a control command (low speed) for driving the electric fan motor (e.g., the electric fan motor 630 of FIG. 6A) with the voltage 2.8V, to the external electronic device (e.g., the electronic device 350 of FIG. 3). According to an embodiment, when the detected internal temperature exceeds 38° C., the electronic device (e.g., the external electronic device 300 of FIG. 3) may send a control command (high speed) for driving the electric fan motor (e.g., the electric fan motor 630 of FIG. 6A) with the voltage 4.6V, to the external electronic device (e.g., the electronic device 350 of FIG. 3).

According to various embodiments, as shown in Table 1, when the detected internal temperature is below 36° C., the electronic device (e.g., the external electronic device 300 of FIG. 3) may send a control command for not driving the electric fan motor (e.g., the electric fan motor 630 of FIG. 6A) to the external electronic device (e.g., the electronic device 350 of FIG. 3), based on the table regarding RPM information. According to an embodiment, when the detected internal temperature exceeds 36° C. and falls below 38° C., the electronic device (e.g., the external electronic device 300 of FIG. 3) may send a control command (low speed) for driving the electric fan motor (e.g., the electric fan motor 630 of FIG. 6A) with the RPM information of 1800 RPM, to the external electronic device (e.g., the electronic device 350 of FIG. 3). According to an embodiment, when the detected internal temperature exceeds 38° C., the electronic device (e.g., the external electronic device 300 of FIG. 3) may send a control command (high speed) for driving the electric fan motor (e.g., the electric fan motor 630 of FIG. 6A) with the RPM information of 2600 RPM, to the electronic device (e.g., the external electronic device 350 of FIG. 3).

According to various example embodiments, the electronic device having the cooling function, which can efficiently dissipate the high heat generating in the external electronic device during the charging or the data exchange, can contribute to reliability enhancement of the external electronic device.

According to various example embodiments, the electronic device having the cooling function (hereafter, referred to as the electronic device) can include a control circuit (e.g., a processor). According to an example embodiment, the electronic device may receive monitored temperature information from the external electronic device, and directly control the electric fan motor based on the table regarding the control commands stored in the memory therein.

According to an embodiment, the electronic device may control the electric fan motor by directly detecting the environment information (e.g., temperature information) from the external electronic device.

According to various example embodiments, an electronic device can include a first housing including a hollow portion configured to receive an external electronic device, and a second housing disposed at an angle defined by a portion coupled with at least part of the hollow portion. The second housing can include a first cover facing at least part of the hollow portion and including a plurality of first openings, a second cover received in the first cover and including a plurality of second openings, and an electric fan motor disposed in a space between the first cover and the second cover, the electric fan motor configured to discharge at least part of intake air from at least some of the first openings to at least some of the second openings.

According to various example embodiments, the second cover can include a holding surface for, when the external electronic device is received in the hollow portion, contacting at least a portion of the external electronic device.

According to various example embodiments, the holding surface can be formed in a circular curved surface which descends from a center to edges.

According to various example embodiments, the second openings can be formed to discharge the air toward the external electronic device which is resting on the holding surface.

According to various example embodiments, the air can be discharged from the second openings, due to the curved surface, to a space between the holding surface and the external electronic device.

According to various example embodiments, the second openings can be formed to discharge toward the external electronic device which is received in the hollow portion.

According to various example embodiments, the second openings can be formed by a coupling structure of the first cover and the second cover along edges of the second cover.

According to various example embodiments, the electronic device can further include a connector disposed in the hollow portion, wherein the connector is coupled with a connector port of the external electronic device which is received in the hollow portion.

According to various example embodiments, at least one support protrusion can protrude near the connector, to support at least part of the external electronic device which is received in the hollow portion.

According to various example embodiments, the electronic device can further include a wireless charging circuit disposed between the electric fan motor and the second cover, and a control circuit, wherein the control circuit is configured to detect the external electronic device which is disposed to face the second cover, using the wireless charging circuit, and when wirelessly charging the external electronic device using the wireless charging circuit, to discharge at least part of the intake air to the wireless charging circuit and the external electronic device using the electric fan motor.

According to various example embodiments, the second housing can be movably coupled to the first housing.

According to various example embodiments, an electronic device can include a first housing including a plurality of first openings, a second cover received in a first cover and including a plurality of second openings, an electric fan motor disposed in a space between the first cover and the second cover, and discharging at least part of intake air from at least some of the first openings to at least some of the second openings, a wireless charging circuit disposed between the electric fan motor and the second cover, and a control circuit. The control circuit can be configured to detect the external electronic device which is disposed to face the second cover, using the wireless charging circuit, and when wirelessly charging the external electronic device using the wireless charging circuit, to discharge at least part of the intake air to the wireless charging circuit and the external electronic device using the electric fan motor.

According to various example embodiments, a surface of the second cover facing the external electronic device can be formed in a circular curved surface which descends from a center to edges.

According to various example embodiments, the air can be discharged from the second openings, due to the curved surface, to a space between the surface of the second cover and the external electronic device.

According to various example embodiments, a method for operating an electronic device can include detecting whether the electronic device rests in an external electronic device having a cooling function, when detecting the resting, detecting whether the electronic device is functionally connected to the external electronic device having the cooling function, when detecting the connection, monitoring a temperature of the electronic device, generating a control command corresponding to the monitored temperature, and sending the generated control command to the external electronic device having the cooling function.

According to various example embodiments, detecting the resting can include detecting that a connector of the external electronic device having the cooling function is electrically connected to a connector port of the electronic device.

According to various example embodiments, detecting the resting can include detecting wireless charging power received from a wireless charging circuit of the external electronic device having the cooling function.

According to various example embodiments, the control command can include information for determining an operation level of an electric fan motor of the external electronic device having the cooling function.

According to various example embodiments, the information can include voltage information for determining the operation level of the electric fan motor based on the temperature.

According to various example embodiments, the information can include RPM information for determining the operation level of the electric fan motor based on the temperature.

While the disclosure has been illustrated and described with reference to various example embodiments thereof, it will be understood by those skilled in the art that various changes in form and details may be made therein without departing from the spirit and scope of the disclosure as defined by the appended claims and their equivalents.

What is claimed is:

1. An electronic device comprising:
a first housing comprising a hollow portion configured to receive an external electronic device; and
a second housing disposed at an angle defined by a portion disposed in at least part of the hollow portion,
wherein the second housing comprises,
a first cover facing at least part of the hollow portion and comprising a plurality of first openings;
a second cover disposed on the first cover and comprising a plurality of second openings; and
an electric fan motor disposed between the first cover and the second cover, and configured to discharge at least part of intake air from at least some of the first openings to at least some of the second openings.

2. The electronic device of claim 1, wherein the second cover comprises:
a holding surface configured to contact at least a portion of the external electronic device when the external electronic device is disposed in the hollow portion.

3. The electronic device of claim 2, wherein the holding surface comprises a substantially circular curved surface which descends from a center of the second cover to edges of the second cover.

4. The electronic device of claim 3, wherein the second openings are configured to discharge the air toward the external electronic device when the external electronic device is resting on the holding surface.

5. The electronic device of claim 4, wherein the electronic device is configured to discharge air from the second openings to a space between the holding surface and the external electronic device, the space being defined by descending portions of the curved surface.

6. The electronic device of claim 1, wherein the second openings are configured to discharge toward the external electronic device when the external electronic device is received in the hollow portion.

7. The electronic device of claim 1, wherein the second openings are formed by a coupling structure of the first cover and the second cover along edges of the second cover.

8. The electronic device of claim 1, further comprising:
a connector disposed in the hollow portion,
wherein the connector is configured to be coupled with a connector port of the external electronic device received in the hollow portion.

9. The electronic device of claim 1, further comprising at least one support protrusion disposed near the connector, and configured to support at least part of the external electronic device when the external electronic device is received in the hollow portion.

10. The electronic device of claim 1, further comprising:
a control circuit interposed between the second cover and the electric fan motor; and
a control circuit operatively coupled with the wireless charging circuit,
wherein the control circuit is configured to detect the external electronic device using the wireless charging circuit, and
the electronic device is configured to discharge at least part of the intake air to the wireless charging circuit and the external electronic device using the electric fan motor.

11. The electronic device of claim 1, wherein the second housing is movably coupled to the first housing.

* * * * *